(12) United States Patent
Tan et al.

(10) Patent No.: US 8,073,031 B2
(45) Date of Patent: Dec. 6, 2011

(54) LASER DIODE WITH IMPROVED HEAT DISSIPATION

(75) Inventors: Wei-Sin Tan, Oxford (GB); Jennifer Mary Barnes, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/041,079

(22) Filed: Mar. 3, 2008

(65) Prior Publication Data
US 2009/0219966 A1    Sep. 3, 2009

(51) Int. Cl.
*H01S 5/00* (2006.01)
(52) U.S. Cl. ................................ 372/46.01; 372/34
(58) Field of Classification Search ............ 372/46.01, 372/34
See application file for complete search history.

(56) References Cited

U.S. PATENT DOCUMENTS

| | | | |
|---|---|---|---|
| 4,084,130 A * | 4/1978 | Holton | 372/50.1 |
| 4,841,536 A * | 6/1989 | Ohishi et al. | 372/46.01 |
| 5,474,954 A | 12/1995 | Yang | |
| 6,862,300 B1 * | 3/2005 | Traut et al. | 372/19 |
| 6,914,923 B2 * | 7/2005 | Yoshitake et al. | 372/45.01 |
| 2002/0053676 A1 * | 5/2002 | Kozaki | 257/88 |
| 2003/0210721 A1 * | 11/2003 | Haneda et al. | 372/46 |
| 2004/0218648 A1 | 11/2004 | Sung et al. | |
| 2005/0242361 A1 * | 11/2005 | Bessho et al. | 257/99 |
| 2005/0281304 A1 * | 12/2005 | Mochida | 372/46.01 |
| 2006/0078024 A1 * | 4/2006 | Matsumura et al. | 372/46.01 |
| 2006/0133439 A1 * | 6/2006 | Yamasaki | 372/44.01 |
| 2006/0280215 A1 | 12/2006 | Son et al. | |
| 2007/0217461 A1 * | 9/2007 | Masui | 372/46.01 |

FOREIGN PATENT DOCUMENTS

| | | |
|---|---|---|
| GB | 2 439 973 | 1/2008 |
| JP | 11-186650 A | 7/1999 |
| JP | 2000-294875 A | 10/2000 |
| JP | 2002-237661 A | 8/2002 |
| JP | 2002-359436 A | 12/2002 |
| JP | 2003-198065 A | 7/2003 |
| JP | 2006-216731 A | 8/2006 |
| JP | 2007-214570 A | 8/2007 |
| JP | 2007-311682 A | 11/2007 |

OTHER PUBLICATIONS

Kneissl et al.; "Performance and degradation of continuous-wave InGaN multiple-quantum-well laser diodes on epitaxially laterally overgrown GaN substrates"; American Institute of Physics; Sep. 2000; vol. 77, No. 13; pp. 1931-1933.
Japanese Office Action for corresponding Japanese Application No. 2009-049656 mailed Mar. 1, 2011 and English translation.

* cited by examiner

*Primary Examiner* — Tod T Van Roy
(74) *Attorney, Agent, or Firm* — Renner, Otto, Boisselle & Sklar, LLP

(57) ABSTRACT

A laser diode structure that includes two different insulator layers, one to maintain good optical confinement, typically located at the sides of the laser ridge, and another to improve the heat dissipation properties, typically located on the etched surfaces away from the ridge.

21 Claims, 30 Drawing Sheets

(Embodiment 1)

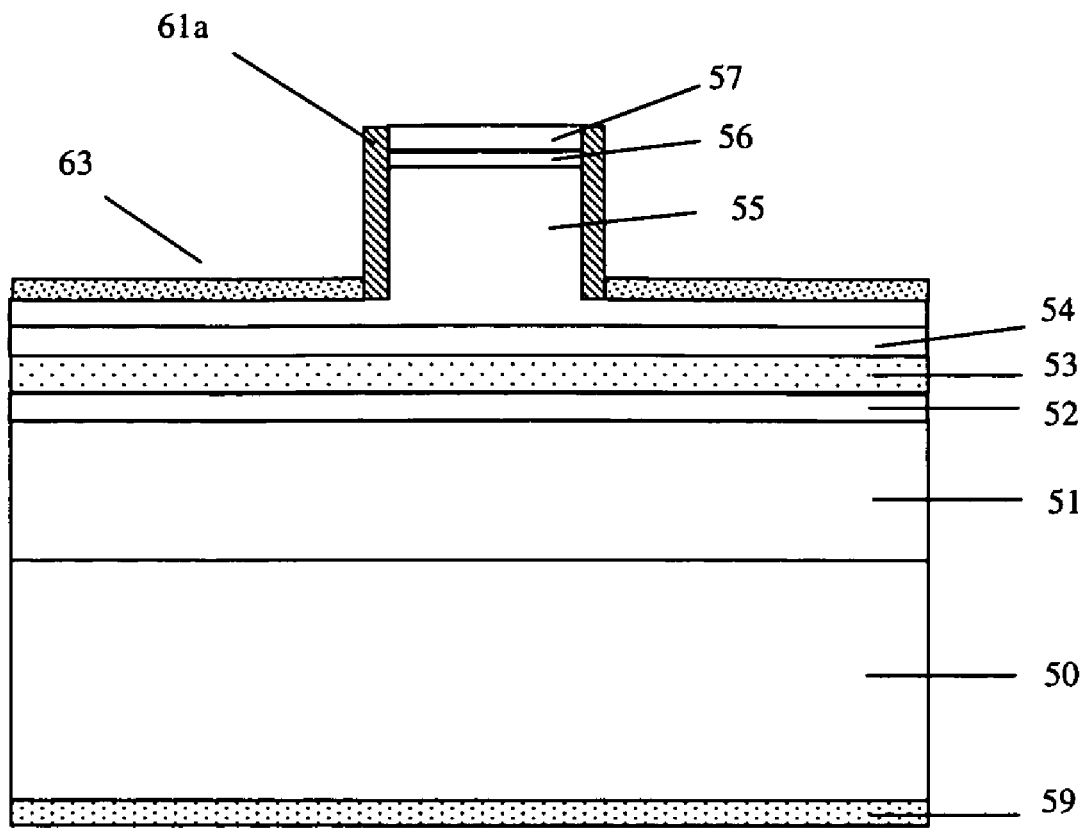
FIG. 4A (Embodiment 1)

FIG. 5B (Embodiment 2)

FIG. 5C (Embodiment 2)
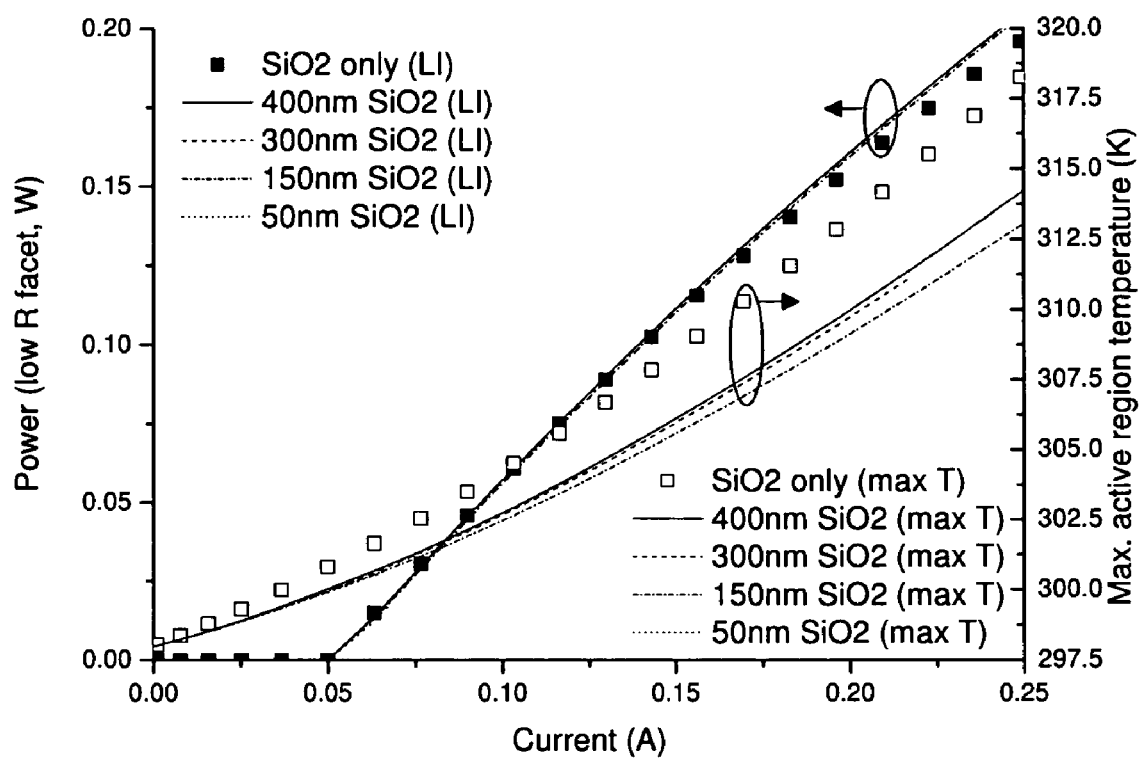

FIG. 5D (Embodiment 2)
Fig. 5D (i) All SiO$_2$
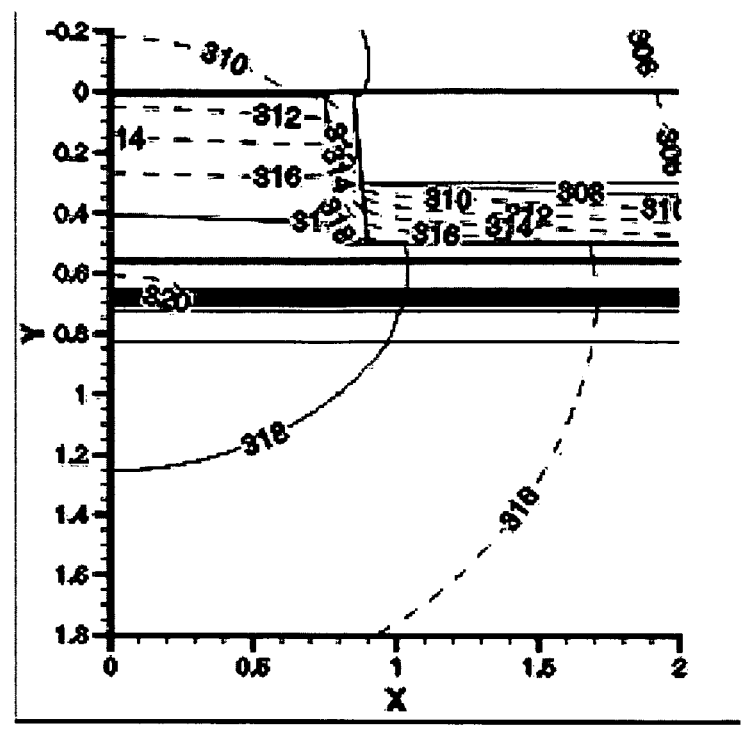
Fig. 5D (ii) 500nm SiO$_2$
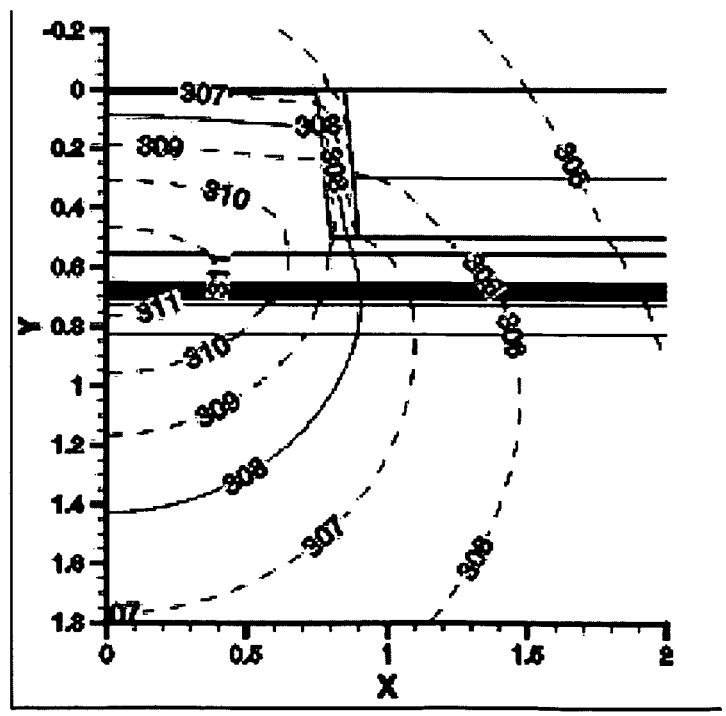

Fig. 5D (iii) 400nm SiO$_2$
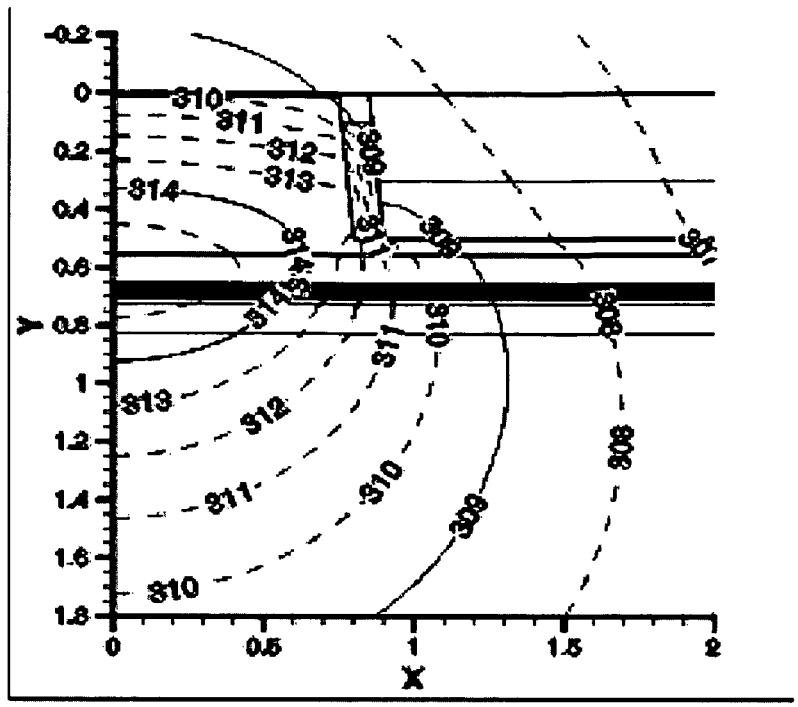
Fig. 5D (iv) 300nm SiO$_2$
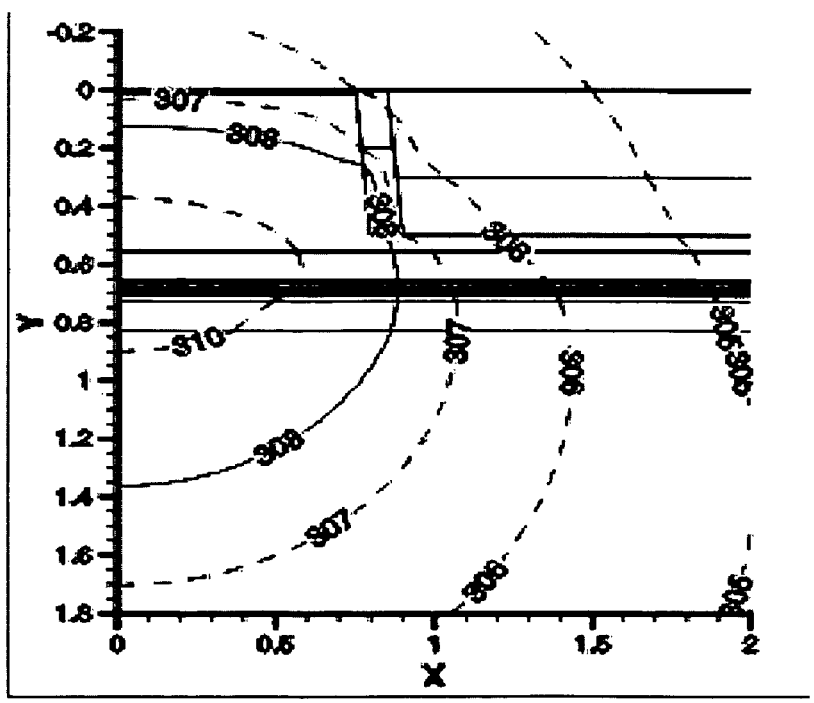

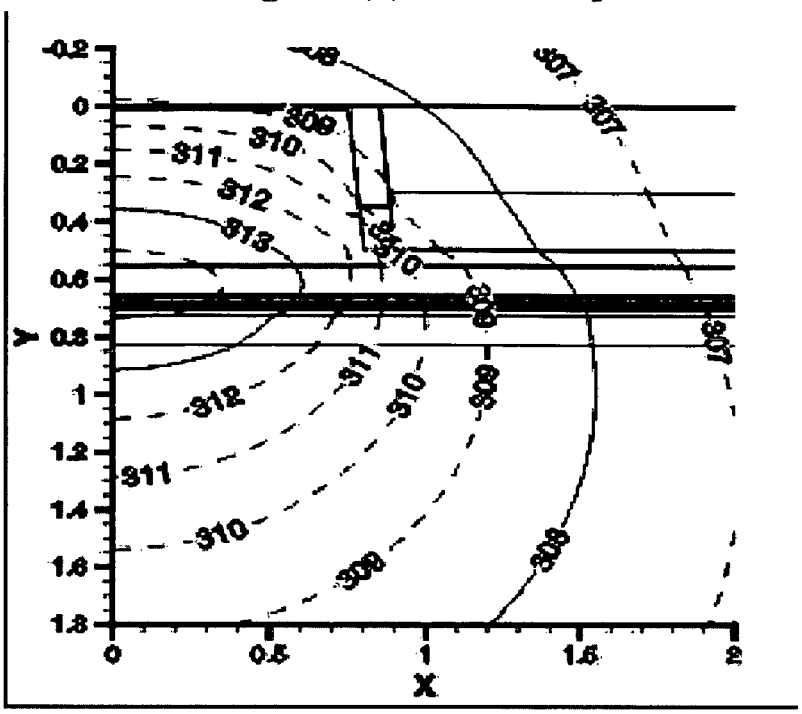
Fig. 5D (v) 150nm SiO₂
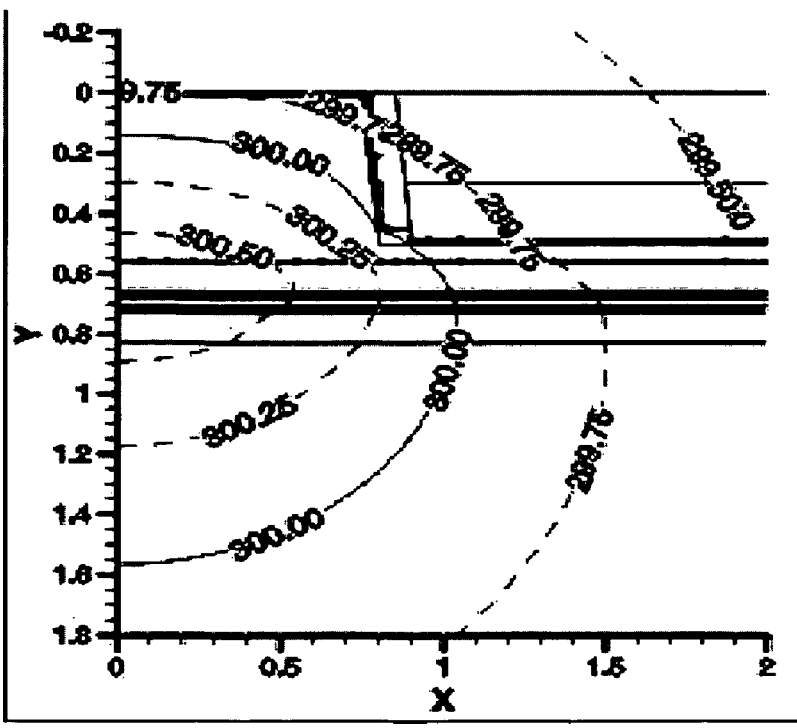
Fig. 5D (vi) 50nm SiO₂

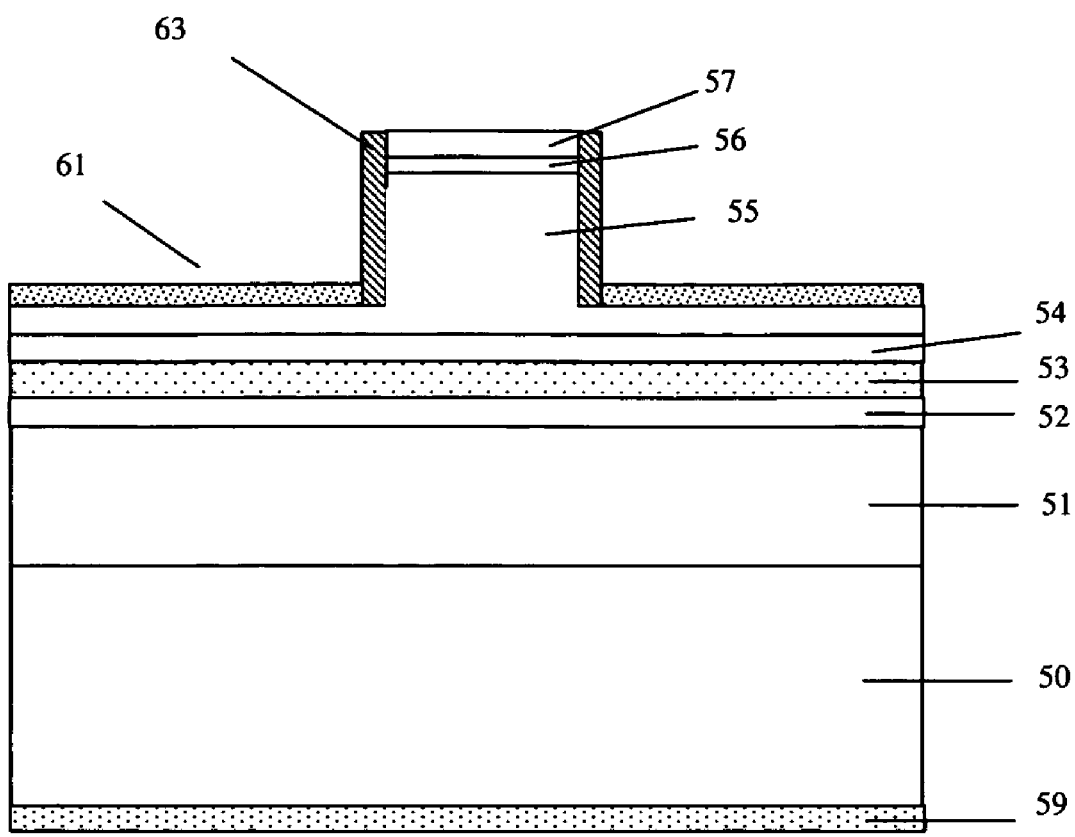
FIG. 6A (Embodiment 3)

FIG. 7B (Embodiment 4)

FIG. 8A (Embodiment 5)

| Ridge Width | Si-rich SiN$_x$/AlN<br>$I_{th}$ for mode to lase/mode loss | SiO$_2$/AlN<br>$I_{th}$ for mode to lase/mode loss |
|---|---|---|
| 2.0μm | 58mA / 6.17cm$^{-1}$ (1$^{st}$ mode)<br>96mA / 20.06cm$^{-1}$ (2$^{nd}$ mode) | 55mA / 3.16cm$^{-1}$ (1$^{st}$ mode)<br>73mA / 7.84cm$^{-1}$ (2$^{nd}$ mode) |
| 1.5μm | 58mA / 8.78cm$^{-1}$ (1$^{st}$ mode)<br>98mA / 22.93cm$^{-1}$ (2$^{nd}$ mode) | 50mA / 2.83cm$^{-1}$ (1$^{st}$ mode)<br>63mA / 4.63cm$^{-1}$ (2$^{nd}$ mode) |

FIG. 9B (Embodiment 6)

LASER DIODE WITH IMPROVED HEAT DISSIPATION

TECHNICAL FIELD

The present invention relates to a semiconductor laser diode. It relates, in particular to a ridge structure laser diode comprising two different materials to effectively dissipate heat at high power operation while maintaining low threshold current. A method of manufacturing such a structure is also presented.

BACKGROUND OF THE INVENTION

Gallium Nitride based semiconductor laser diodes (LDs) are widely used in optical storage such as Blu-ray or high definition digital video discs (HD-DVD), as means of transferring, writing or reading data. As these devices are rapidly commercialised, there is a requirement for high power LDs, in particular for high-speed writing in these systems. However, at high power operation self-heating can affect the LD device characteristics, reducing the slope efficiency and maximum power output and increasing the threshold current. This effect can also reduce the operating lifetime. Therefore, a LD that can dissipate heat efficiently while maintaining low threshold current is required.

FIG. 1 is a cross sectional view of a conventional ridge waveguide structure of a semiconductor laser diode as described in U.S. Pat. No. 5,474,954 to Yang. The ridge structure formed on the upper cladding layer 6 defines the region whereby current is injected into the active layer 4, thus limiting the width of the resonance area. This ensures a stable transverse mode and low threshold current for lasing. From FIG. 1, the structure consists of an n-GaN substrate 1, an n-AlGaN cladding layer 2, an n-GaN lower waveguide layer 3, a InGaN active layer 4, a p-GaN upper waveguide layer 5, a p-AlGaN cladding layer 6 and a p-GaN contact layer 7. The refractive indices of the n-AlGaN cladding layer 2 and p-AlGaN cladding layer 6 are lower than that of the n-GaN waveguide layer 3 and p-GaN waveguide layer 5 respectively. In addition, the refractive indices of the n-GaN waveguide layer 3 and p-GaN waveguide layer 5 are lower than that of the InGaN active layer 4. An insulator layer, usually $SiO_2$, is then formed on the sidewalls of the ridge (layer 8a) and on the etched surfaces at the bottom of the ridge (layer 8). A window is made on top of the ridge for the p-type upper electrode 9 to make electrical contact with the p-GaN contact layer 7. The lower n-type electrode is formed on the back of the n-GaN substrate 10. The poor thermal conductivity of $SiO_2$ (k=1 W/mK) in this structure limits the heat dissipation properties of the laser diode under high power operation. This results in self-heating which limits the device lifetime.

In FIG. 2, a dual layer insulator structure is used to improve the laser diode heat dissipation properties as described in US2004/0218648A1 to Sung et al. For this structure, a protective layer 11 having a thermal conductivity higher than the buried layer is formed on top of the buried layer. High thermal conductivity insulators such as $TiO_2$ (k~25 W/mK) are typically used in this case. However, for p-side down mounted devices, the heat generated in this structure would initially still need to overcome the poor thermal conductivity $SiO_2$ layer before reaching the high thermal conductivity protective layer. The protective layer also fully covers the buried.

FIG. 3 illustrates a high thermal conductivity and resistive MBE-grown $Al_xGa_{1-x}N$ layer (k~40-200 W/mK) 12 is formed as the insulator layer to improve the heat dissipation properties as discussed in GB0613890 to Hooper et al. However, the higher refractive index (RI) of the $Al_xGa_{1-x}N$ layer (RI~2.3) compared with the conventional $SiO_2$ (RI~1.5) results in reduced optical confinement, resulting in an increased threshold current compared to the current invention.

For high power laser diode applications, it is important that the excess heat generated by the device is efficiently dissipated. As discussed above, in general, good thermally conducting insulators have a high refractive index and using them as the sole insulator layer will degrade the optical confinement and increase the threshold current. This results in a higher dissipated power for the laser diode, which degrades the lifetime of the device. On the other hand, insulators with low refractive index, which are beneficial for good optical confinement, are generally poor thermal conductors, and are not suitable for high power devices.

SUMMARY OF THE INVENTION

The present invention describes a laser diode structure that simultaneously overcomes the heat dissipation and optical confinement problem. The laser diode structure includes two different insulator layers, one to maintain good optical confinement, typically located at the sides of the laser ridge, and another to improve the heat dissipation properties, typically located on the etched surfaces away from the ridge.

An aspect of the invention is to encapsulate the ridge mesa sidewalls with a low refractive index layer (i.e. $SiO_2$), while the etched regions of the device are encapsulated with a high thermal conductivity insulator layer. This structure provides good heat dissipation properties without affecting the mode control of the laser diode. As will be shown in the embodiments, the theoretical threshold current is shown to be equivalent to the conventional laser diode, whilst a reduced active region temperature reduces the thermal rollover of the output power. This in turn is expected to increase the laser diode lifetime during high power LD operation.

Another aspect of the invention provides a manufacturing method for such a structure, using a self-alignment and sacrificial layer technique. Accordingly, the manufacturing method of a semiconductor laser diode comprising the steps of: (a) providing a sequential structure comprising of a conducting n-type substrate, a n-type cladding layer, a n-type waveguide layer, an active region, a p-type waveguide layer, a p-type cladding layer and a p-type cap layer; (b) forming a ridge structure laser diode comprising a p-type electrode and a sacrificial metal layer on top of the ridge; (c) forming the first insulator on the entire ridge structure; (d) using anisotropy dry etching to etch the first dielectric layer from the etched surfaces and on top of the ridge, leaving the first insulator layer to only encapsulate the mesa sidewalls; (e) forming a second insulator layer on the entire ridge structure; and (f) removing the sacrificial layer to lift-off the second insulator layer on top of the ridge.

According to a particular aspect of the invention, a ridge structure semiconductor laser diode is provided. The diode includes a first material encapsulating the ridge sidewalls, and a second material, different from the first material, encapsulating etched regions of the structure.

According to another aspect, the first material is one of a low refractive index insulator and a high thermal conductivity insulator, and the second material is the other of the low refractive index insulator and the high thermal conductivity insulator.

In accordance with yet another aspect, the first material is the low refractive index insulator and the second material is the high thermal conductivity insulator.

According to still another aspect, the low refractive index insulator encapsulates the ridge sidewalls at the bottom region of the ridge, and the high thermal conductivity insulator encapsulates the etched regions of the structure and the upper region of the ridge sidewalls.

With yet another aspect, the first material is the high thermal conductivity insulator and the second material is the low refractive index insulator.

In yet another aspect, the ridge structure is formed within a trench structure.

According to another aspect, the low refractive index insulator exhibits an absorption greater than 1000 cm$^{-1}$ at the wavelength of the laser diode.

According to yet another aspect, the second material is formed on the ridge sidewalls and the etched regions of the structure, and the first material is formed on the second material along the ridge sidewalls.

In accordance with another aspect, the low refractive index insulator has a refractive index which is greater than 1.0 and at least 0.1 less than the index of refraction of the ridge.

In accordance with still another aspect, the refractive index of the low refractive index insulator is at least 0.5 less than the index of refraction of the ridge.

According to another aspect, the refractive index of the low refractive index insulator is at least 1.0 less than the index of refraction of the ridge.

According to another aspect, the refractive index of the low refractive insulator is substantially within the range of 1.55 to 2.32.

With still another aspect, the high thermal conductivity insulator has a thermal conductivity of at least 10 W/mK.

According to another aspect, the high thermal conductivity insulator has a thermal conductivity of at least 200 W/mK.

In accordance with another aspect, the refractive index of the low refractive insulator is substantially within the range of 1.55 to 2.32, and the high thermal conductivity insulator has a thermal conductivity of at least 200 W/mK.

According to another aspect of the invention, a method is provided for fabricating a ridge structure semiconductor laser diode. The method includes forming a sacrificial layer above one or more layers which are to form the laser diode; applying a mask layer above the sacrificial layer and patterning the mask layer to define the laser diode ridge dimensions; etching the sacrificial layer and plurality of layers from regions not protected by the patterned mask layer to form the laser diode ridge; depositing a first insulator layer over the entire area with good sidewall conformality so as to cover the ridge sidewalls; anisotropically etching the first insulator layer to a predetermined thickness such that the insulator remains only on the ridge sidewalls and is removed from other areas; depositing the second insulator layer over the entire area; and removing the sacrificial layer, so that layer or layers that have remained above the sacrificial layer are lifted off.

According to another aspect, a method is provided for fabricating a ridge structure semiconductor laser diode. The method includes applying a mask layer to above one or more layers which are to form the laser diode; patterning the mask layer to define a ridge, channel and platform areas of a trench structure for the laser diode; etching the one or more layers to a predetermined depth to form channels between the ridge and platform areas; depositing a first insulator layer over the entire area with good sidewall conformality so as to cover the ridge sidewalls; masking the platform area and anisotropically etching the first insulator layer in the ridge and channel areas to a predetermined thickness leaving the first insulator as encapsulating only the sidewalls of the ridge and channel areas; depositing a second insulator layer over the entire area; depositing a layer of photoresist over the entire area, and removing the photoresist from the platform and ridge areas so as to leave the photoresist only in the channel area; etching the second insulator layer from the platform and ridge regions, and then removing the photoresist from the channel area; and etching the second insulator from the sidewalls of the ridge and channel areas while the second insulator remains at the base of the channel area.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 4A through 4H are simulation data illustrating the cross sectional view, the lattice temperature profile and light output power versus current for a conventional structure and the present invention, described in Embodiment 1;

FIGS. 5A through 5D are cross sectional views and simulation data of the invention structure and an improved invention structure, as described in Embodiment 2;

FIGS. 6A through 6D are cross sectional views of the reversed invention structure and also simulation data illustrating the light output power versus current and active region temperature profile of a conventional structure and the invention structure, as described in Embodiment 3;

FIGS. 7A through 7D are cross sectional views of the conventional trench structure and trench invention structure, including simulation data illustrating the active region temperature profile as a function of trench length and current for both structures, as described in Embodiment 4;

FIGS. 8A through 8C illustrates the concept of mode suppression using absorbing SiN to maintain single mode operation for wide ridge widths, as described in Embodiment 5;

FIGS. 9A and 9B are cross sectional views for another version of the invention, as described in Embodiment 6;

DETAILED DESCRIPTION OF THE INVENTION

Figure 1:
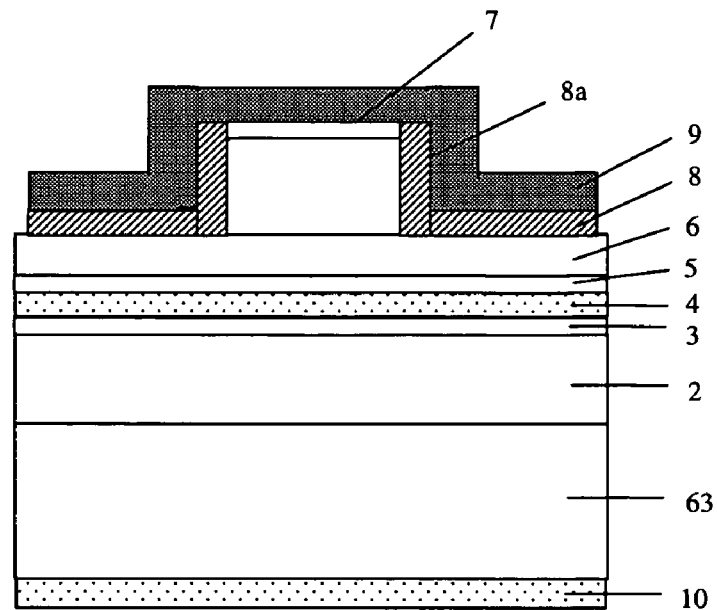
FIG. 1 is a cross section of a ridge waveguide laser diode with a conventional single layer insulator.
Figure 2:
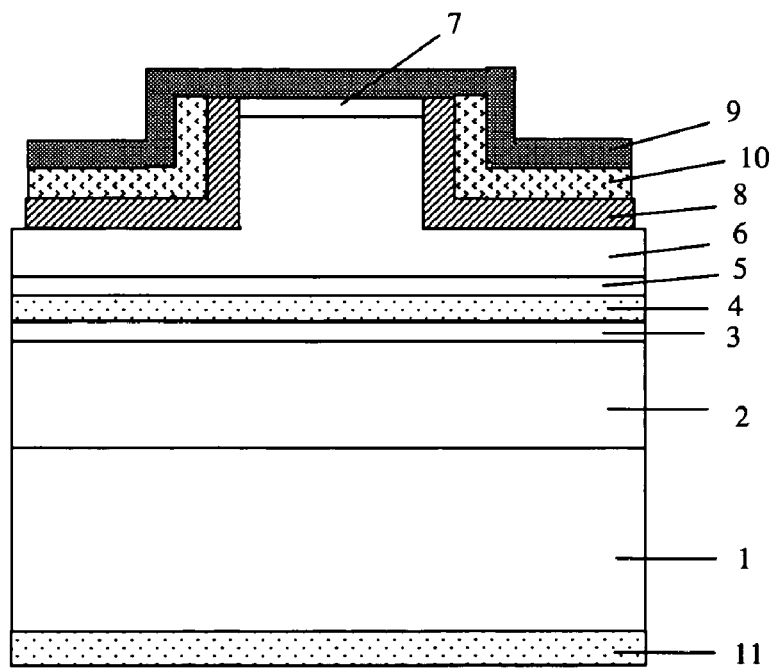
FIG. 2 is a cross section of a conventional ridge waveguide laser diode with a double layer insulator layer.

The present invention provides a laser diode structure with both good optical confinement and heat dissipation properties.

To obtain good optical confinement in index guided semiconductor lasers, a material which has a lower refractive than the laser semiconductor, is formed on the sides of the ridge. The difference in refractive index between the two materials could be as small as 0.1, but the larger the difference the better the optical confinement. Therefore a range of refractive index could be defined for the 'lower refractive index material', $n_{lower}$, compared to the refractive index of the laser semiconductor, $n_{laser}$, as given by equation 1:

$$(n_{laser}-0.1) > n_{lower} > 1 \qquad \text{equation 1}$$

More preferably, a slightly larger difference in refractive index should be used, e.g.

$$(n_{laser}-0.5) > n_{lower} > 1 \qquad \text{equation 2}$$

For an embodiment of this invention, an even larger difference in refractive index is used:

$$(n_{laser}-1.0) > n_{lower} > 1 \qquad \text{equation 3}$$

For the case of a GaN laser diode ($n_{laser}$=2.55), an example of typical insulators that can be used are $SiO_2$ ($n_{lower}$=~1.55), $Si_3N_4$ ($n_{lower}$=~1.90) ZnO ($n_{lower}$=~2.0) and AlN ($n_{lower}$=~2.32). For laser diodes made from other semiconductors (e.g. GaAs, AlGaInP), the refractive index of the laser ($n_{laser}$) is typically larger (3-3.5) but the materials listed above could also be used for these lasers.

A high thermal conductivity insulator is preferable to minimise any self-heating effects during high power laser operation. Improved heat dissipation will reduce active region temperature, thus increasing operating lifetime and improve slope efficiency. An insulator typically has thermal conductivity, $\kappa$=1 W/mK, and an example of such a material is $SiO_2$. It is preferable that $\kappa$>10 W/mK, and examples of materials with this value are $TiO_2$ and $Si_3N_4$ ($\kappa \approx$20 W/mK). However, for very efficient heat dissipation, it is most preferable that $\kappa$>200 W/mK. An example of such material is AlN ($\kappa \approx$245 W/mK). However any other material which is an insulator but has a thermal conductivity >10 W/mK or more preferably >200 W/mK could also be used in this invention.

i) Embodiment 1

A first embodiment of a laser diode structure in accordance with the present invention is illustrated in FIG. 4A. Referring to FIG. 4A, the laser diode structure includes a substrate 50 (such as n-type GaN substrate), followed by an n-type lower cladding layer 51, an n-type lower waveguide layer 52, an active layer 53, a p-type upper waveguide layer 54, a p-type upper cladding layer 55, and a p-type contact layer 56. The cladding layers are formed by material having a lower refractive index than the waveguide layers, and the waveguide layers have a lower refractive index than the active layer. The active layer 53 may consist of a single or multiple-quantum well structure. It is preferable that a thin $Al_xGa_{1-x}N$ blocking layer is inserted at one or both ends of the active layer to reduce carrier leakage into the waveguide layers. Electrical contact is made via the p-type electrode layer 57 and the n-type electrode layer 59. A low refractive index insulator (i.e., $SiO_2$) is used to encapsulate the sidewalls 61a of the ridge, while a high thermal conductivity insulator layer 63 (e.g. AlN) is used to encapsulate the etched regions of the device. Typically a gold or other metallic layer is deposited over layers 57, 61a and 63 but this is not shown for clarity.

In FIG. 1, the aforementioned conventional laser diode structure is shown. For this structure, a low refractive index insulator (i.e. $SiO_2$) is formed on both the sidewalls 8a and etched regions of the device 8.

Figure 4C:
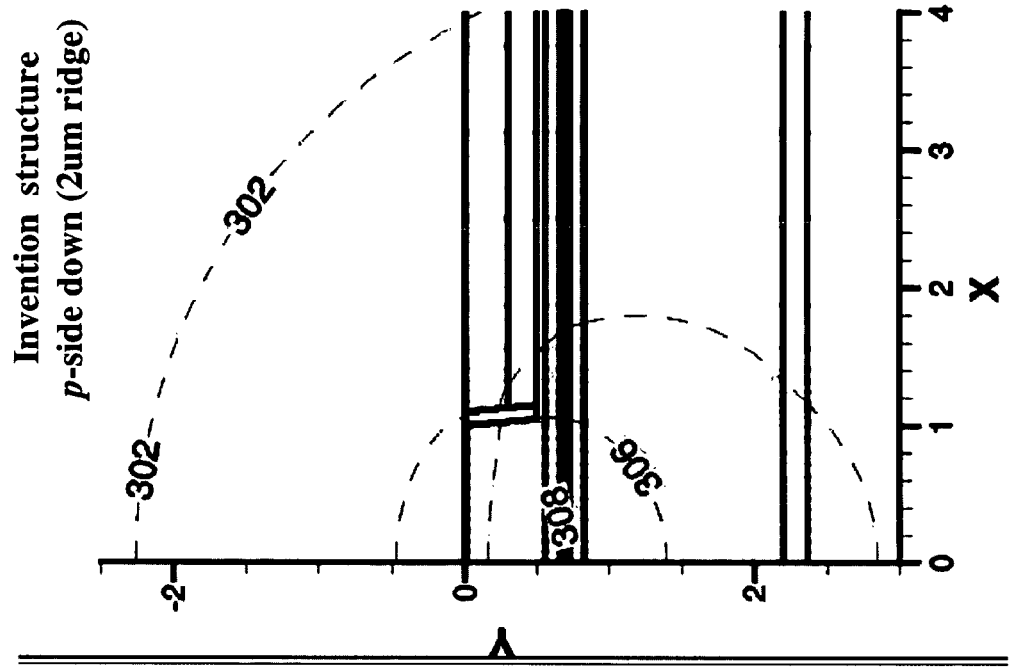
Figure 4B:
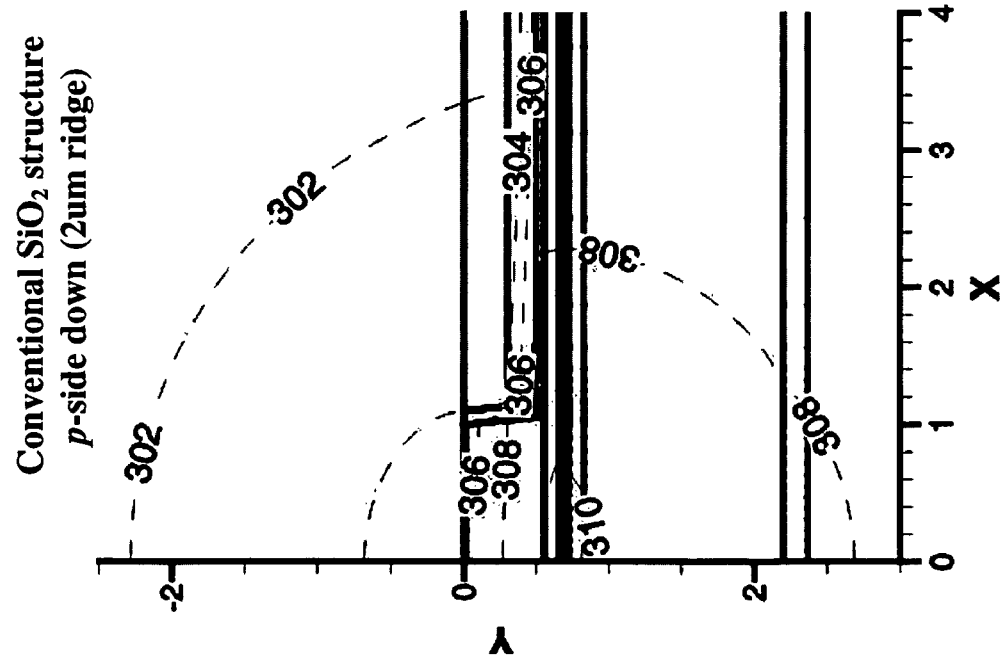

A commercial laser diode simulator has been used to simulate and compare the characteristics of both structures. FIG. 4B and FIG. 4C show the lattice temperature profile of the conventional $SiO_2$ structure and the invention structure. This was simulated for a 2.0 μm ridge waveguide at an operating current of 200 mA, with the device mounted p-side down. From the graphs, it can clearly be seen that heat is more efficiently dissipated for the invention structure. A 2.3° C. improvement in active region temperature is obtained at 200 mA using the invention, and this improvement increases with increasing current.

$$t_1 = A_T \exp(E_a/kT_1) \qquad \text{equation 4}$$

Figures 4D, 4E:
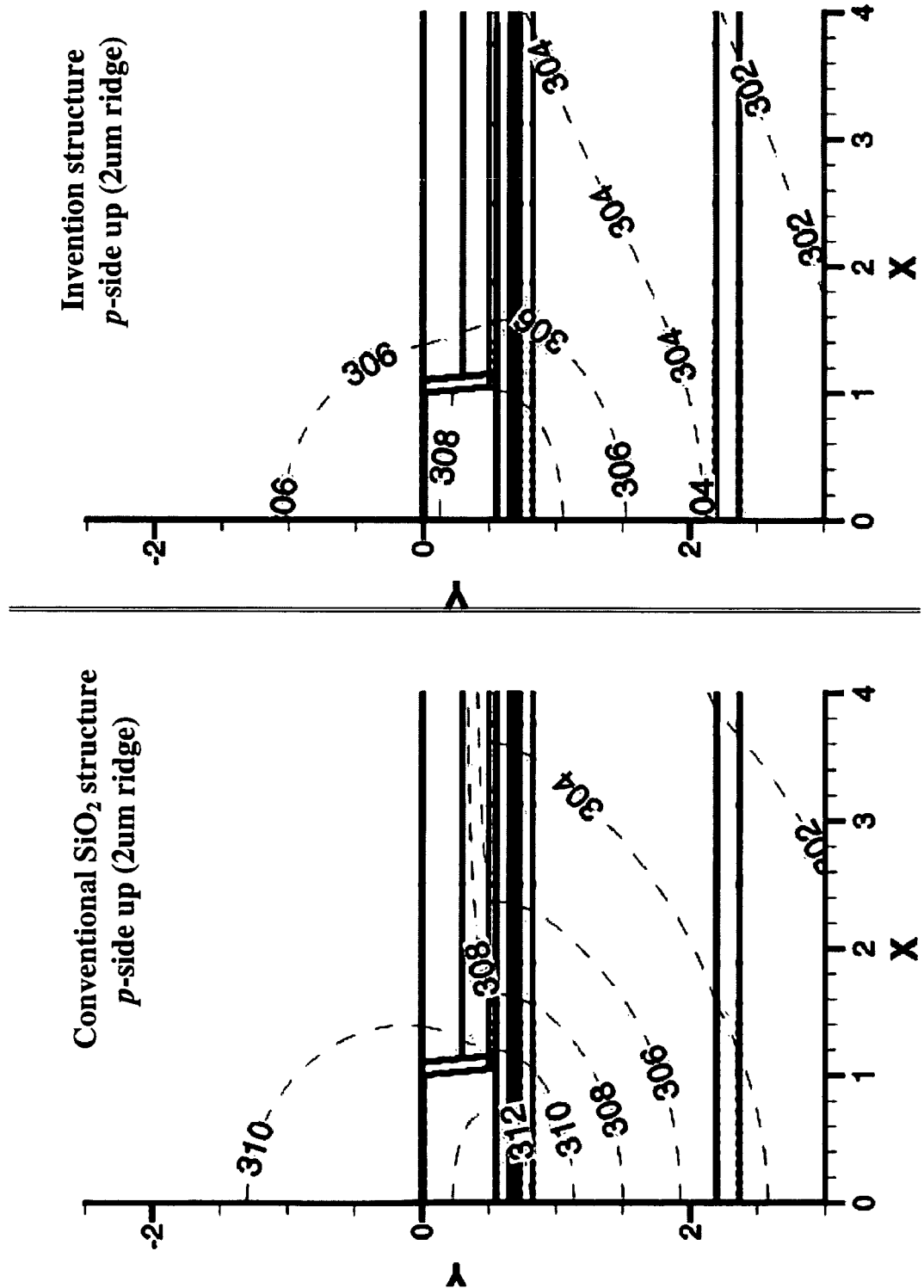

Referring to equation 4, a 2.3° C. difference in active region temperature translates to a 15% improvement in LD lifetime ($E_a$ is taken to be 0.5 eV in this case (value taken from M. Kenissl et al, Applied Physics Letters, vol. 77, no. 13, pp. 1931-1933 (Sep. 2000)). In FIG. 4D and FIG. 4E, the lattice temperature profile is shown for p-side up mounted devices. Similar to p-side down mounted devices, a temperature reduction is obtained for the invention structure over the conventional structure. The temperature reduction is slightly better for p-side down versus p-side up mounted devices.

Figure 4F:
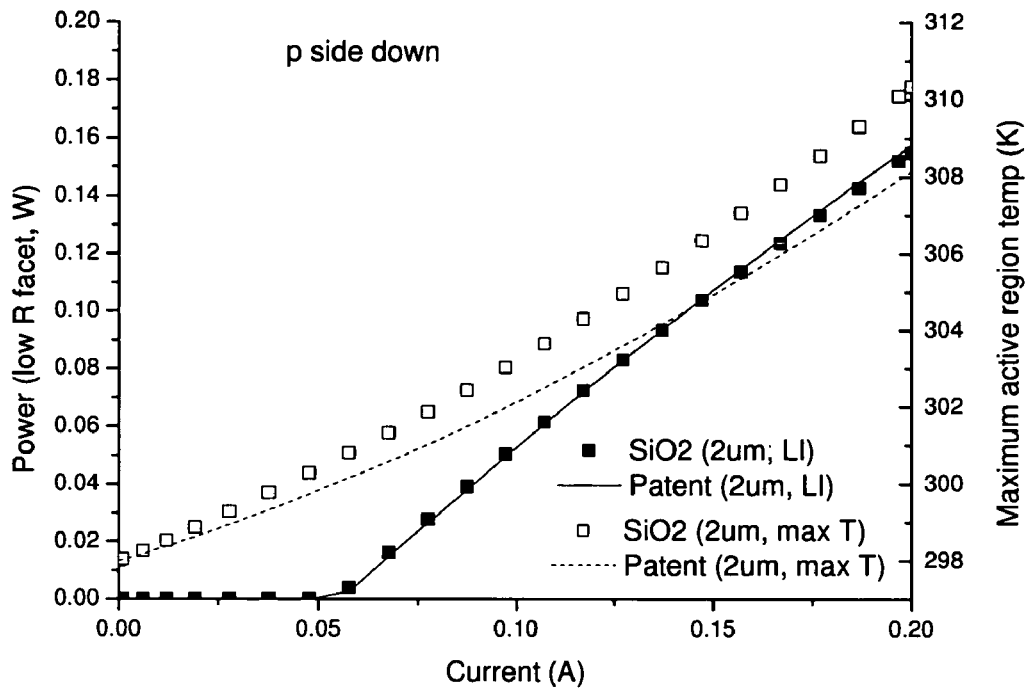
Figure 4G:
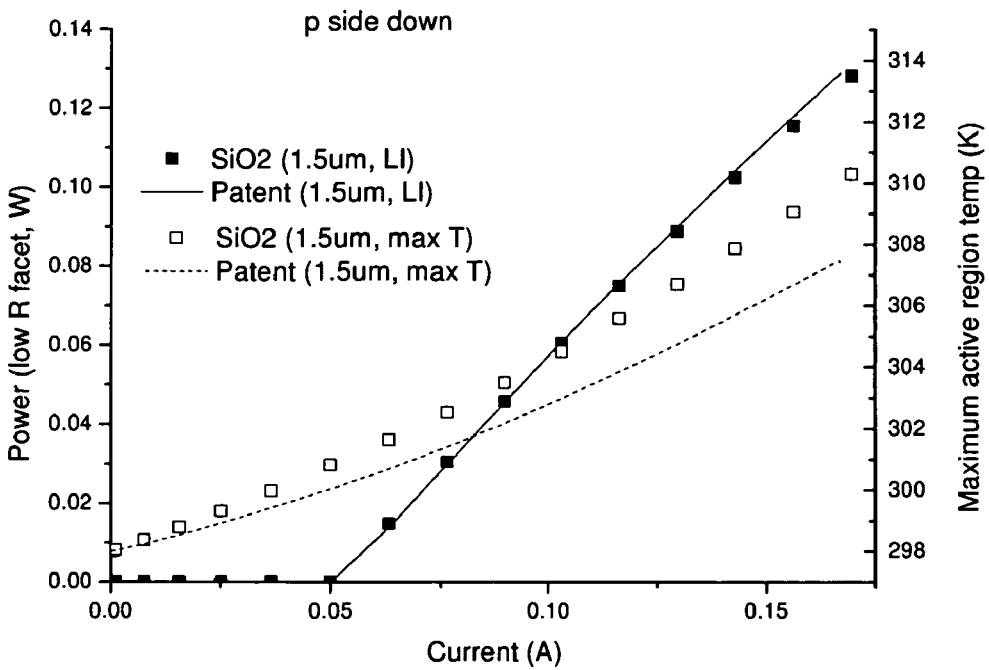
Figure 4H:
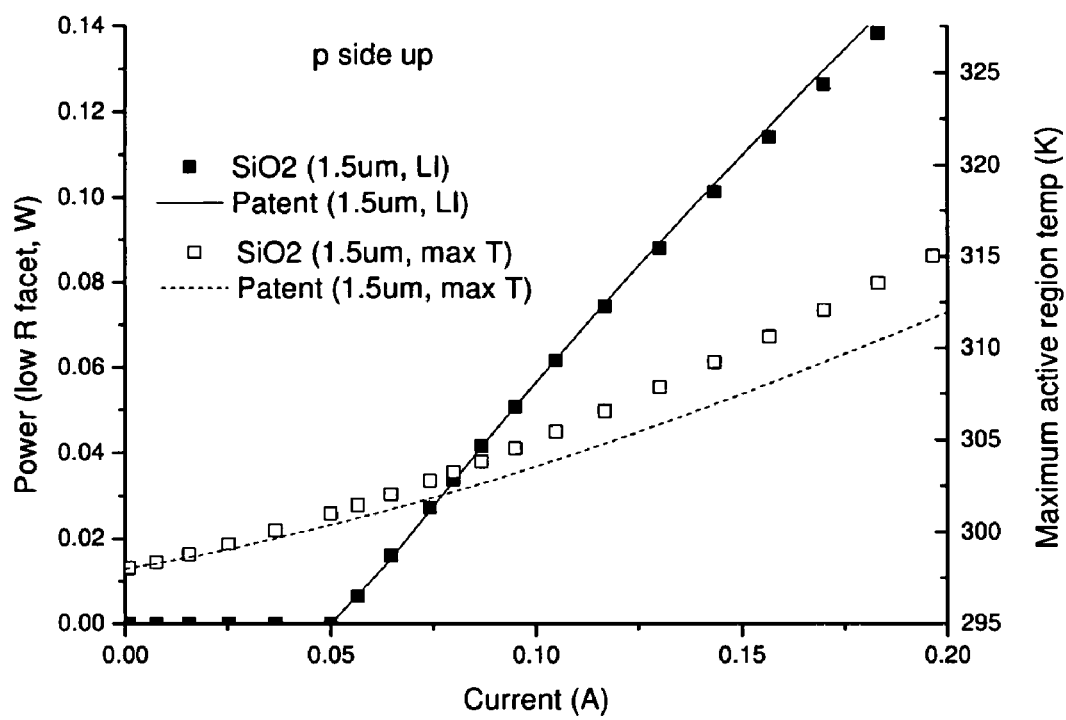

FIG. 4F (p-side down) shows the simulated light output power versus current (L-I) and maximum active region temperature versus current between the invention and conventional structure (for a 2.0 μm ridge waveguide LD). From the graph, a gradual improvement in active region temperature with increasing current is obtained for the invention structure. The improvement in thermal dissipation also results in a reduced thermal rollover at high power operation, and this can be observed between the L-I characteristics of the two devices. Another important aspect of the invention is that the heat dissipation improvement becomes more significant with reducing ridge width. Ridge widths of <1.5 μm are desirable for high power nitride blue laser diodes to ensure only fundamental mode lasing at high current injection. The heat generated at the facets becomes more localised for smaller ridge widths, hence, making efficient heat dissipation more critical for smaller devices. FIG. 4G (p-side down) shows a similar plot to FIG. 4F, but is now simulated for a small 1.5 μm waveguide LD. From the graph, a 2.8° C. reduction in temperature is obtained at an operating current 170 mA. This translates to a 19% improvement in LD lifetime at the same operating current. Referring to the L-I curves, the improved heat dissipation of the invention structure also results in reduced thermal rollover at high power operation, thus ensuring good slope efficiencies even at high power operation. FIG. 4H shows the simulated plot for p-side up mounted devices (1.5 μm waveguide) and the improvement in heat dissipation and reduced thermal rollover at high output powers remain evident over the conventional structure.

ii) Embodiment 2

Figure 5A:
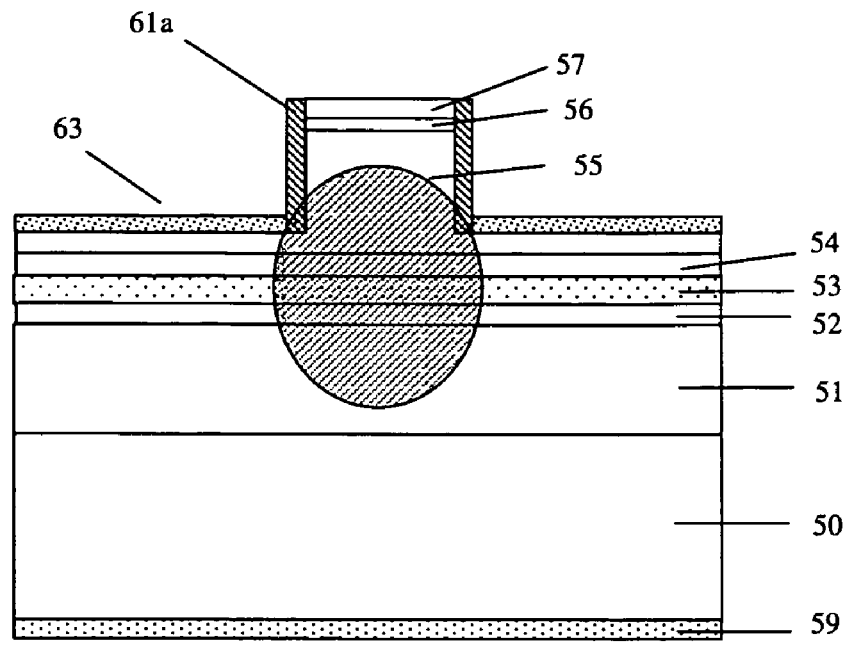
Figure 5A:
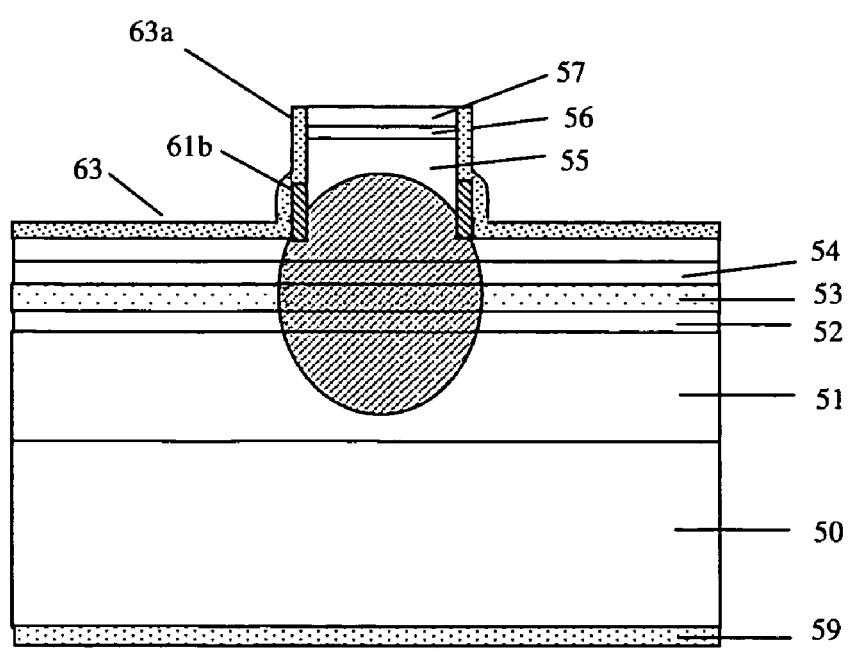

According to this embodiment, the structure in FIG. 4A can be modified and improved to the structure shown in FIG. 5B. FIG. 5A shows the overlap of the optical mode with the low refractive index $SiO_2$ insulator 61a occurs mainly at the bottom of the ridge. Therefore, good optical mode confinement can still be achieved by having the $SiO_2$ layer only at the bottom region of the ridge sidewalls 61b. A high thermal conductivity insulator (i.e. AlN) can then replace the $SiO_2$ layer at the top region of the ridge sidewalls 63a, thus allowing better heat dissipation through the top of the ridge, as shown in FIG. 5B. In FIG. 5C, the simulated L-I characteristics and active region temperature is shown for the conventional $SiO_2$-only structure (FIG. 1) and the invention structure, as a function of different $SiO_2$ thickness at the ridge sidewalls. In the simulation, the mesa height of the ridge sidewall is fixed at 500 nm, hence 500 nm-$SiO_2$ refers to the insulator thickness covering the entire ridge sidewall, as depicted in FIG. 5A. From FIG. 5C, 400 nm-$SiO_2$ refers to the $SiO_2$ layer covering the first 400 nm in height from the bottom of the ridge sidewalls, and the remaining 100 nm at the top will be covered with a high thermal conductivity AlN layer (for e.g. FIG. 5B). Similarly, 150 nm-$SiO_2$ refers to 150 nm of $SiO_2$ at the bottom and 350 nm of AlN at the top. From the L-I curves, reducing the $SiO_2$ thickness down to 150 nm is shown to have negligible effect on the laser diode L-I characteristic. At $SiO_2$ thicknesses below 150 nm, the optical mode confinement begins to be affected by the thin $SiO_2$ layer, thus resulting in increased threshold current and poorer slope efficiency. From the active region temperature curves, a gradual reduction in $SiO_2$ thickness resulted in a gradual improvement to the active region temperature. This is attributed to improved heat dissipation through the AlN layer at the top of the ridge sidewall. FIG. 5D shows the lattice temperature profile for different $SiO_2$ layer thicknesses at the ridge sidewalls. It can clearly be seen that a gradual reduction in lattice temperature is obtained with reducing $SiO_2$ thickness. However, as shown from the L-I curves, too thin a $SiO_2$ will result in poor optical confinement and increased threshold current, hence a trade-off must be obtained. Based on the simulated curves, a $SiO_2$ thickness of ~150-200 nm from the bottom of the ridge is optimum to maintain good optical confinement and excellent heat dissipation.

iii) Embodiment 3

Figures 6B, 6C:
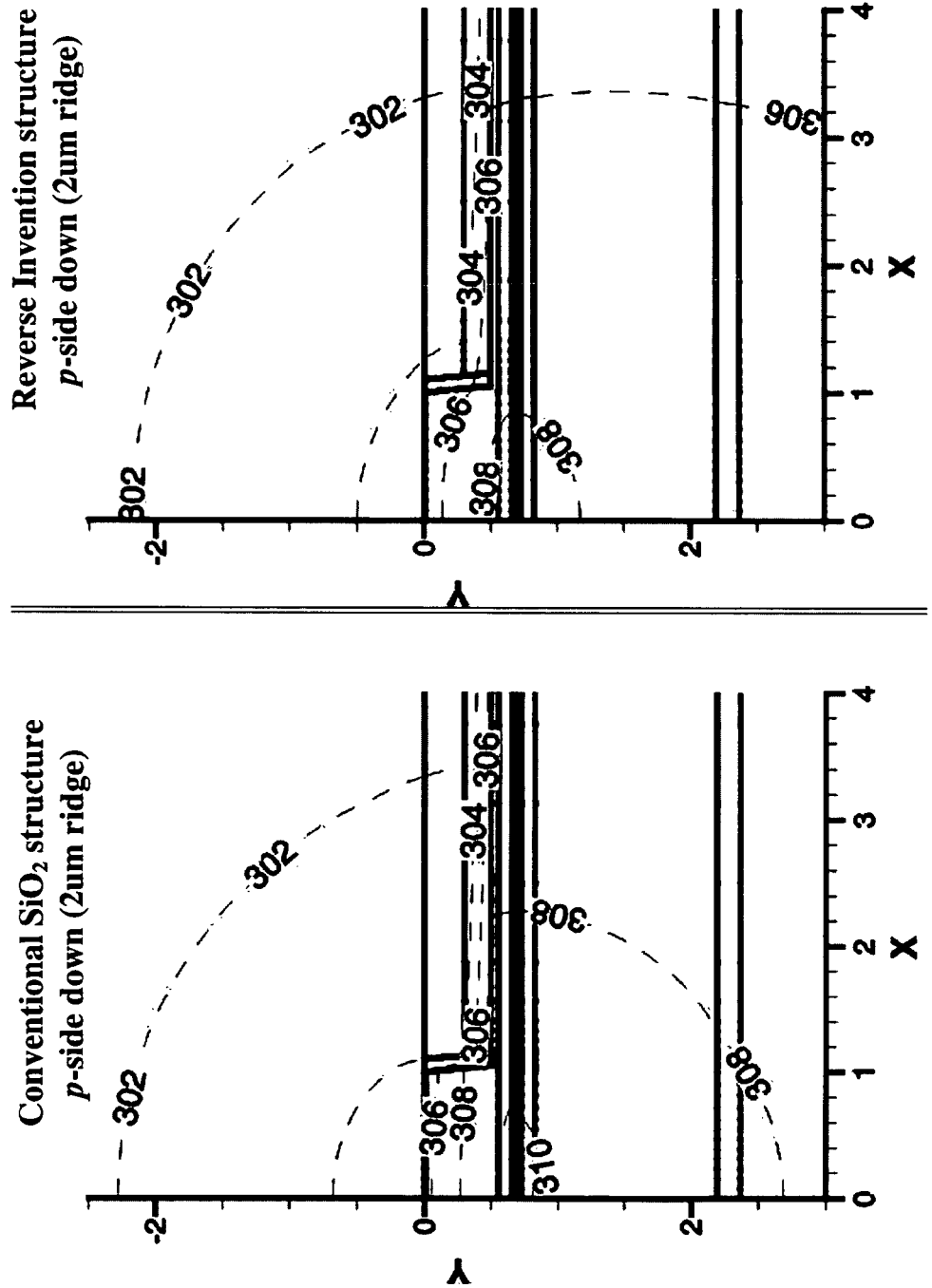
Figure 6D:
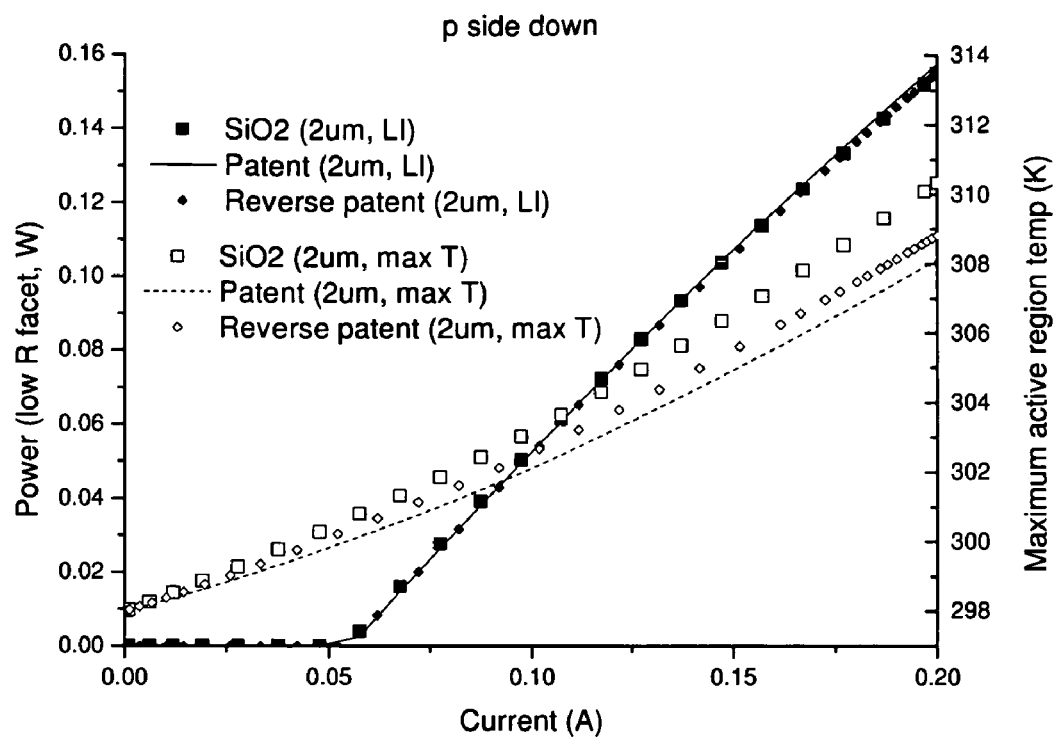

According to this embodiment, a reverse structure is also proposed, and is shown in FIG. 6A. For this structure, the high thermal conductivity insulator layer 63 is formed at the ridge sidewalls while the low refractive index insulator layer 61 is formed at the etched surfaces. FIG. 6B and FIG. 6C show the simulated active region temperature profile in Kelvin for the reverse structure of the invention (FIG. 6C) and the conventional single layer insulator structure (FIG. 6B). FIG. 6D compares the L-I characteristics and active region temperature profile for the original invention structure, the reverse invention structure and the conventional single layer $SiO_2$ structure. From the graphs, the reverse invention structure has a reduced active region temperature profile over the conventional structure, but is still poorer than the original invention structure. Observe that the L-I curve for the original invention structure (embodiment 1) has a much reduced thermal roll-over at higher output powers, due to more efficient heat dissipation.

iv) Embodiment 4

Figure 7A:
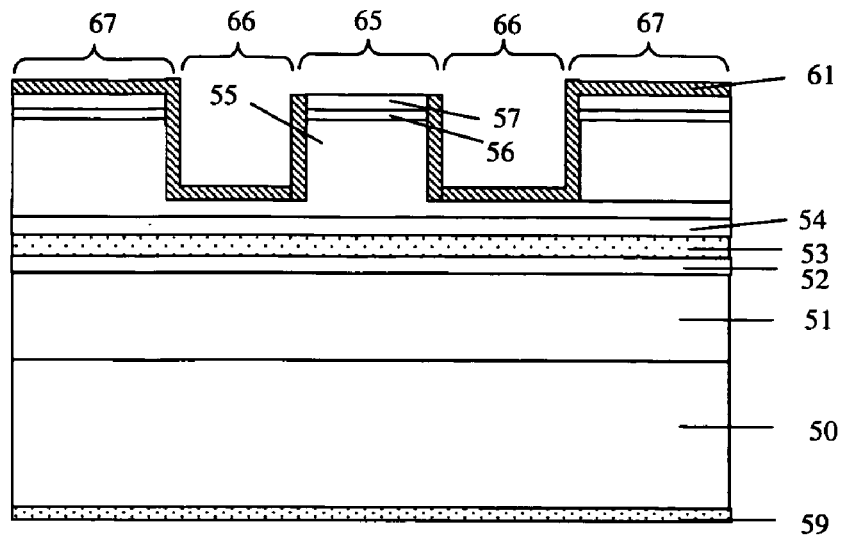
Figure 7A:
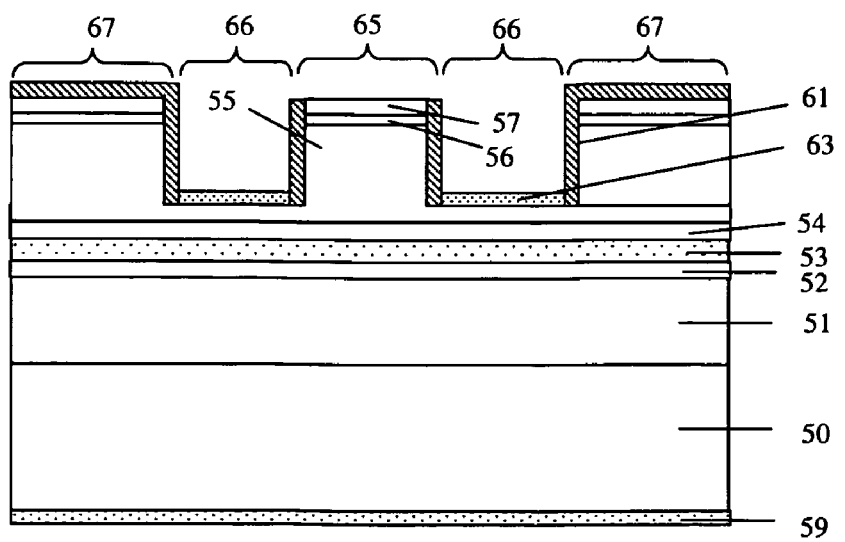

FIG. 7A shows a conventional trench structure whereby the active ridge waveguide layer 65 is formed in a trench configuration, with double channels 66 and a platform area 67. The trench structure is typically used for more efficient p-side down mounting since the structure is planarised compared to the conventional ridge structure in FIG. 1. If the structure in FIG. 1 is not planarised prior to p-side down mounting, the ridge may be damaged thus leading to reduced yield. The trench structure may also benefit from improved heat dissipation properties if the channel region 66 is made sufficiently narrow for heat to be dissipated through the platform area 67, due to more efficient heat dissipation on crystalline structures. For a conventional trench structure, the method of making is similar to a ridge structure, whereby a low refractive index insulator is initially deposited over the entire region 65-67, and a contact window opened on top of the ridge 65 for electrical contact. However, the thermal dissipation properties of FIG. 7A can be further improved using the invention structure and is shown in FIG. 7B.

Figure 7C:
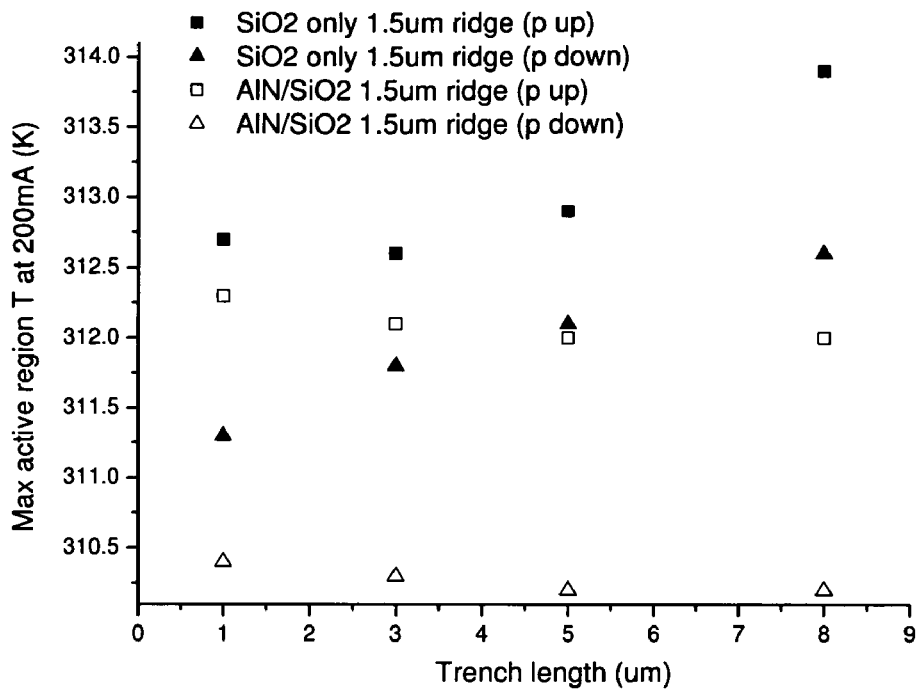
Figure 7D:
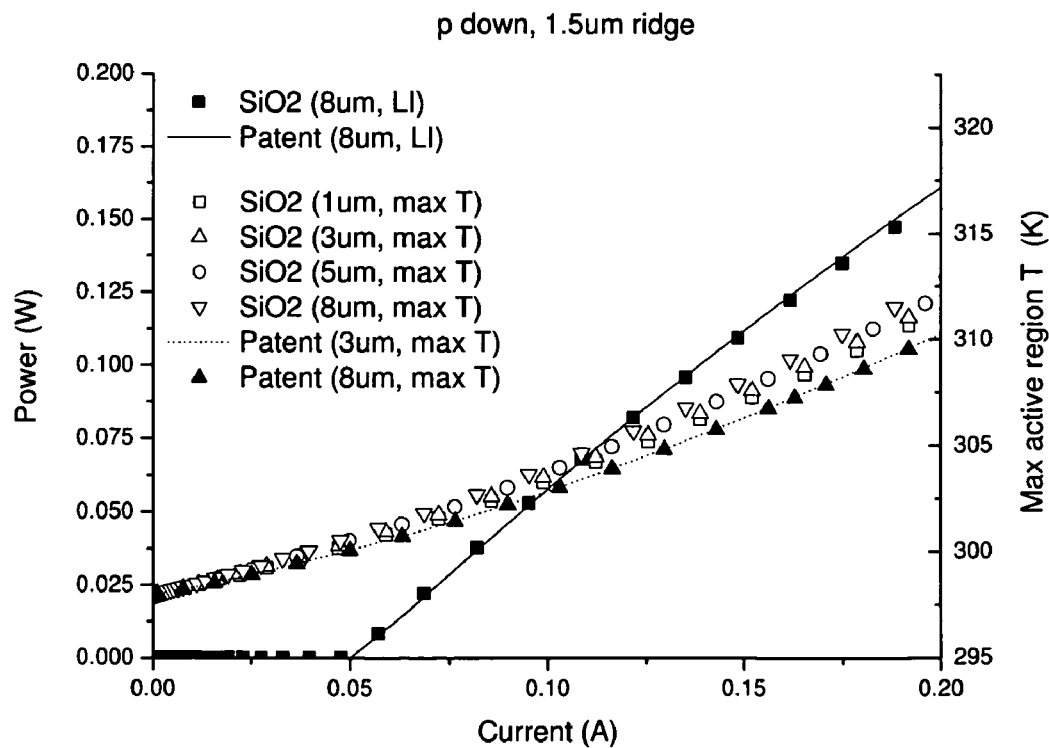

For the trench invention structure (FIG. 7B) in accordance with the present embodiment of the invention, the low thermal conductivity layer 61 is replaced with a high thermal conductivity insulator layer 63 on the channel region 66. FIG. 7C shows the maximum active region temperature (for both p-side up and p-side down mounting) plotted against the trench/channel length for the conventional trench structure (FIG. 7A) and trench invention structure (FIG. 7B). For the conventional trench structure ($SiO_2$ insulator only), the active region temperature decreases as the trench/channel length is reduced from 8 um to 1 um. However, the method of making to obtain trench length <5 um is difficult and can lead to production yield problems for large scale manufacturing. On the contrary, for the trench structure (e.g., AlN/$SiO_2$ insulator) according to the invention, the active region temperature is little affected with reducing trench/channel length since the high thermal conductivity AlN layer can effectively dissipate heat from the channel region itself. Therefore, a wide channel length can be employed if the invention structure is used, and this will be easier to manufacture and also improve the heat dissipation properties of the laser diode simultaneously. Note that the active region temperature is also lower for the invention structure compared to the conventional structure, and for both p-side up and p-side down mounting. FIG. 7D shows the maximum output power and active region temperature plotted against current for the conventional and invention trench structure. For the L-I curve, the invention structure has a reduced thermal rollover at high operating powers when compared to the conventional structure due to more efficient heat dissipation. For the active region temperature profile in FIG. 7D, the observations are similar to FIG. 7C, whereby the active region temperature of the invention structure remains little affected with varying trench length since most of the heat is dissipated through the high thermal conductivity AlN layer. However, for the conventional trench structure, decreasing the trench length can reduce the active region temperature due to heat being dissipated through the crystalline platform area 67. Nevertheless, the active region temperature remains lowest for the invention structure. This clearly demonstrates the poor heat dissipation capabilities across the $SiO_2$ layer and highlights the importance of having a device structure with a combination of both an optical confinement insulator layer (but with poor thermal conductivity) and a high thermal conductivity insulator layer for better heat management. This results shows that the invention can be successfully employed for trench laser diode structure which is important for large scale manufacturing purposes.

v) Embodiment 5

Figure 8B:
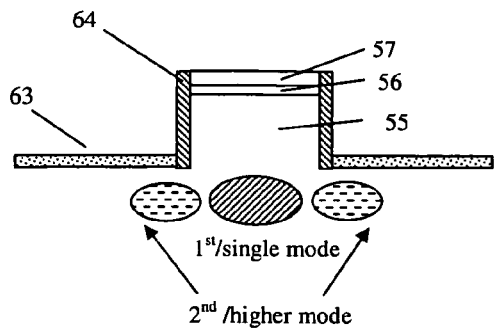
Figure 8C:
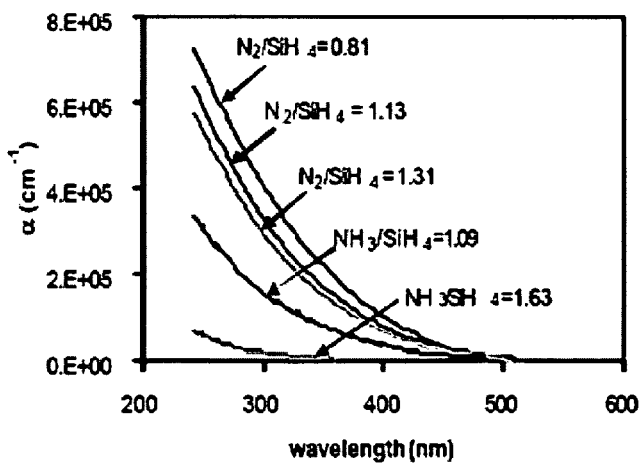

According to this embodiment, FIG. 8A illustrates an invention structure which uses an absorbing layer of $SiN_x$ at the sidewalls of the ridge 64 and a high thermal conductivity insulator layer 63 at the etched regions of the device structure. Narrow ridges (less than 2 μm width) are essential for single mode nitride edge emitting lasers. However, these can be difficult to manufacture. A wide ridge width can cause more than one optical mode to lase, which can affect the far field pattern and coupling of the light into certain applications. Conventionally, $SiO_2$ is used to insulate the ridge from the large area bondpads, due to its low refractive index (good for confinement) and very low absorption. This embodiment describes the use of a wider ridge whilst increasing the mode loss for higher order modes (by modifying the insulator properties), making them less likely to lase in comparison to the main mode. This can be achieved by increasing the Si-inclusions in the $SiN_x$ layer (non stoichiometric SiN), which makes it optically absorbing. This feature can then be tailored to produce significant absorption around 400 nm, which increases the mode loss for all but the fundamental optical mode, making other modes less likely to lase. Therefore, this invention allows wider ridges to be used, while ensuring only fundamental mode lasing. The presence of the thermally conducting insulator layer 63 at the etched surfaces also ensures efficient heat dissipation for high power applications. FIG. 8B shows the absorption of SiN for different ratios of nitrogen:silane or ammonia:silane during deposition, thus describing how the properties of the Si-rich $SiN_x$ can be tailored. In FIG. 8C, the table shows the threshold current and the corresponding mode loss for the first and second order modes, for both $SiO_2$ and Si-rich $SiN_x$ as the insulator. A larger mode loss increases the threshold current required for the higher order modes to begin lasing.

Various other materials could be used in place of the SiN, though it is preferred that a) the material is an insulator, b) the material has a suitable refractive index compared to the refractive index of the laser material as specified in equations 1-2 and c) the material has an absorption greater than 1000 $cm^{-1}$ at the wavelength of the laser, and more preferably an absorption greater than 10,000 $cm^{-1}$.

vi) Embodiment 6

Figure 3:
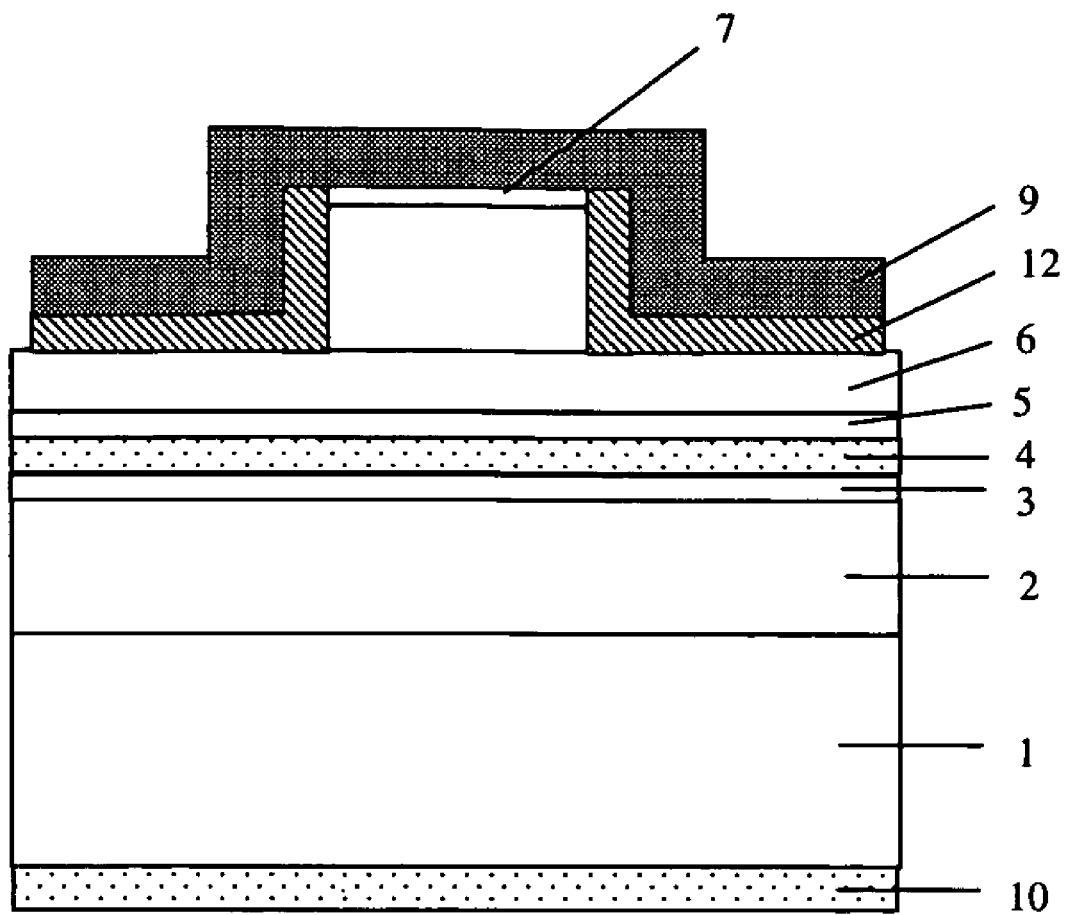
FIG. 3 is a cross section of a conventional ridge waveguide laser with a high thermal conductivity insulator.
Figure 9A:
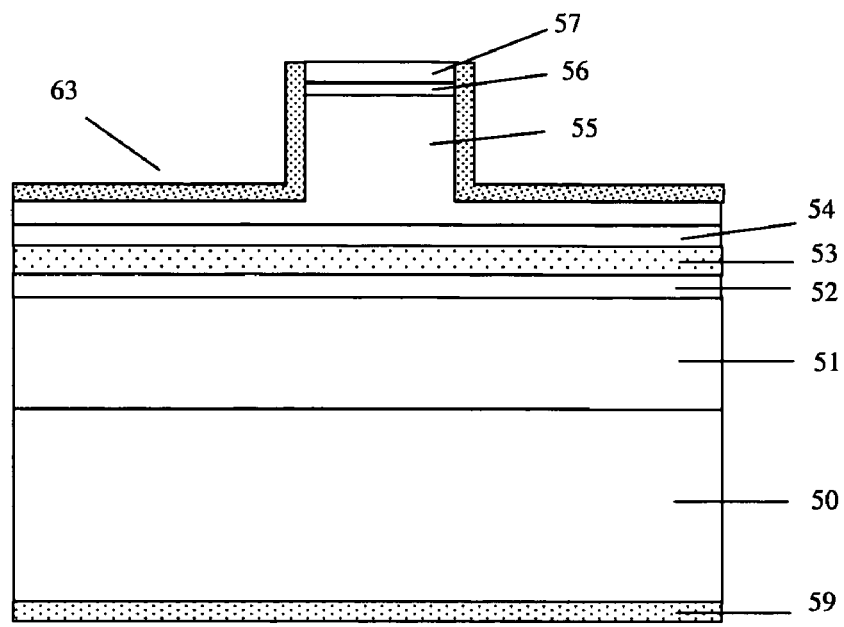
Figure 9A:
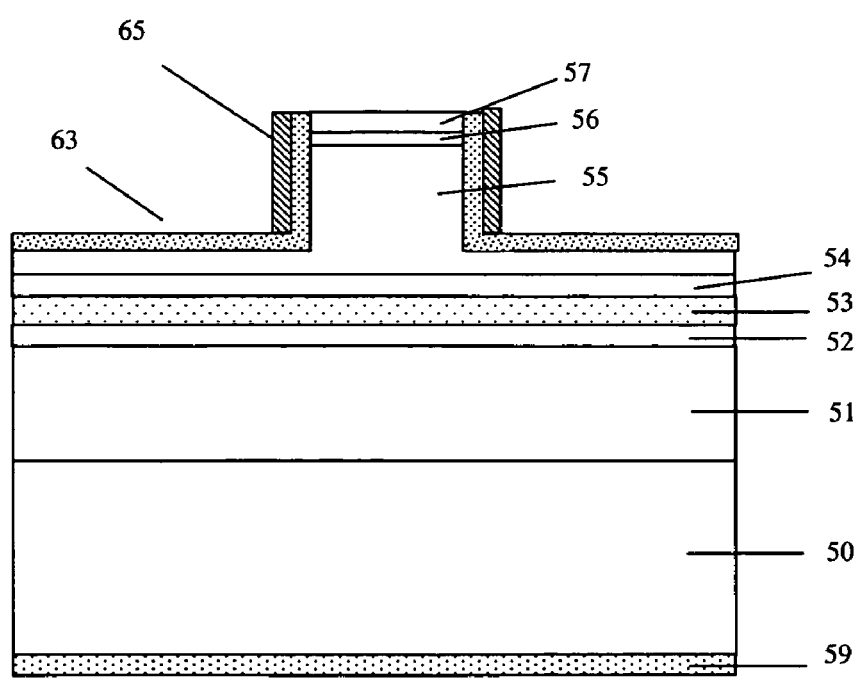

According to this embodiment, the invention can also consist of the following structure. FIG. 9A represents a conventional structure as described above in relation to FIG. 3. For this structure, a thermally conducting insulator (i.e. AlN) 63 is used to isolate the ridge from the bond pads. However, such insulators usually have high refractive index and this leads to poor optical confinement, resulting in absorption from the gold bond pads and subsequently increased threshold current. Using a self alignment process as described below, a low refractive index insulator (i.e $SiO_2$) 65 can be formed on sidewalls of the AlN insulator (refer to FIG. 9B). This can help improve the optical confinement of the structure, while maintaining good heat dissipation properties due to the presence of AlN on the vicinity of the ridge.

vii) Embodiment 7

A manufacturing method of the present invention for embodiment 1 will be described and the drawings are not done to scale. The method sequences described however do not represent a complete fabrication process for the respective chip, but rather represent those germane to the present invention.

Figure 10A:
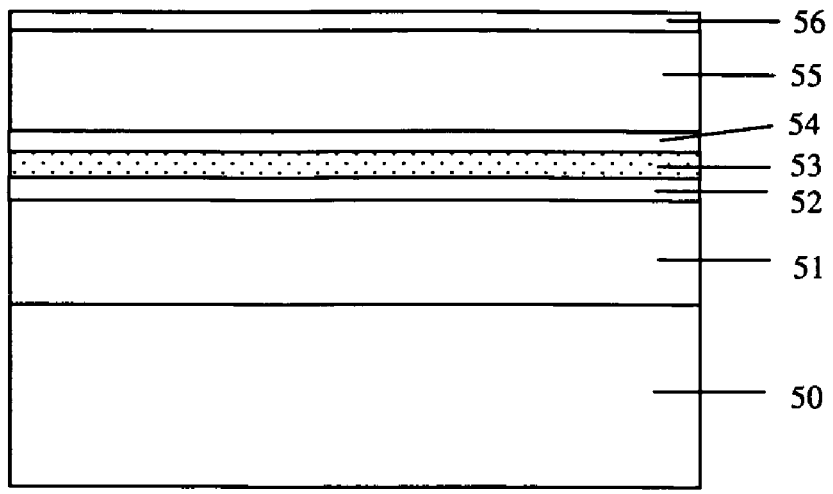
FIGS. 10A through 10H are cross sectional views illustrating a method of manufacturing a laser diode according to Embodiment 7 in the present invention.

Referring to FIG. 10A, the laser diode structure begins with a substrate 50 (such as n-type GaN substrate), which is followed by an n-type lower cladding layer 51, an n-type lower waveguide layer 52, an active layer 53, a p-type upper waveguide layer 54, a p-type upper cladding layer 55, and a p-type contact layer 56. The active layer 53 may consist of a single or multiple-quantum well structure.

Figure 10B:
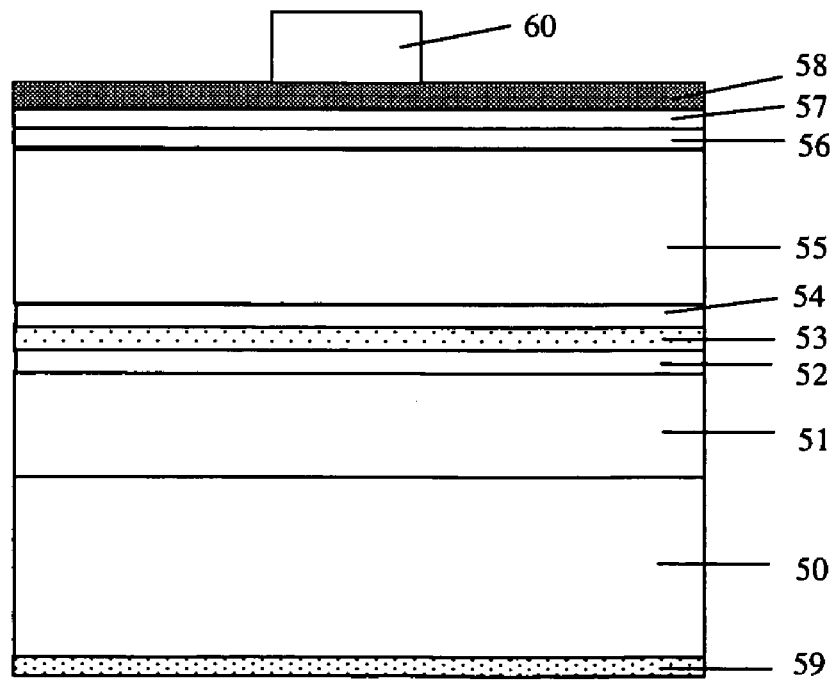

From FIG. 10B, a first p-type electrode layer 57 (such as Pd with a thickness of ~30 nm) is applied over the whole area thereof, followed by a sacrificial layer 58 made of Mo (thickness ~100 nm). The n-type electrode 59 (such as Ti/Al, with a thickness of ~20 nm/100 nm) is formed on the n-substrate. A photoresist layer 60 is then applied and patterned to define the area of the ridge.

Figure 10C:
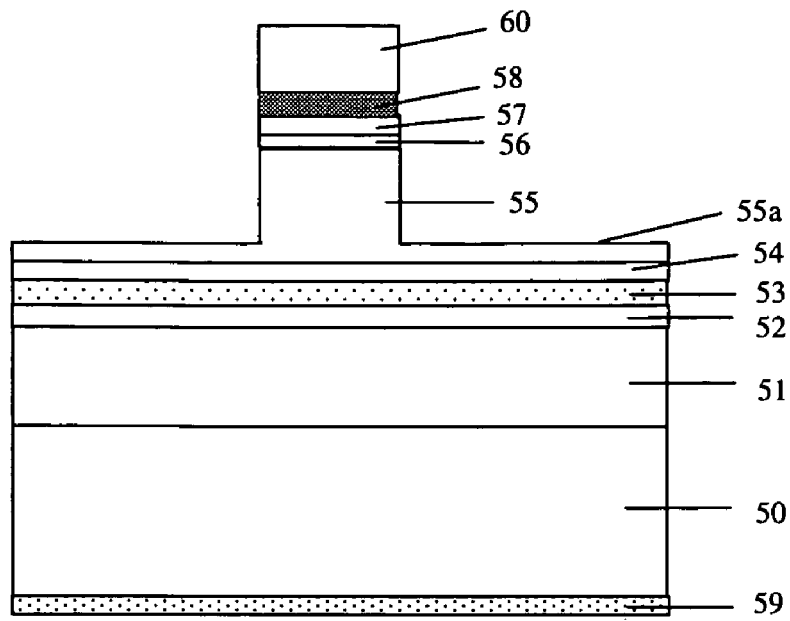

In FIG. 10C, the p-type electrode 57 and Mo sacrificial layer 58 is then completely removed from regions not protected by the photoresist using dry etching (for example, by means of ICP or RIE). Using the same photoresist mask, the epitaxial layer is then etched to a predetermined depth (500 nm in this case) by inductively coupled plasma, usually down to the lower half of the upper cladding layer 55a.

Figure 10D:
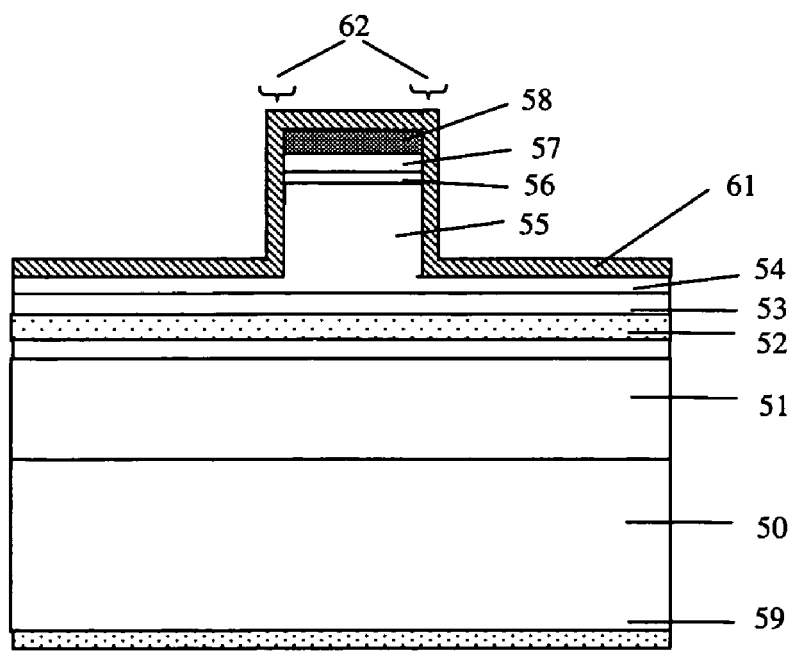

After stripping the photoresist mask, the first insulation layer 61 made of $SiO_2$ (due to its low refractive index of 1.5) having a thickness of ~100 nm is deposited over the entire area by means of PECVD or sputtering. It is essential that a deposition system with good sidewall conformality be used for this process. Since the ridge has a good aspect ratio (appears almost vertical), and owing to the conformal sidewall coverage of the $SiO_2$ deposition, the thickness of the $SiO_2$ at the mesa sidewalls 62, when viewed from the top appears to be at least 500 nm. This is shown in FIG. 10D.

Figure 10E:
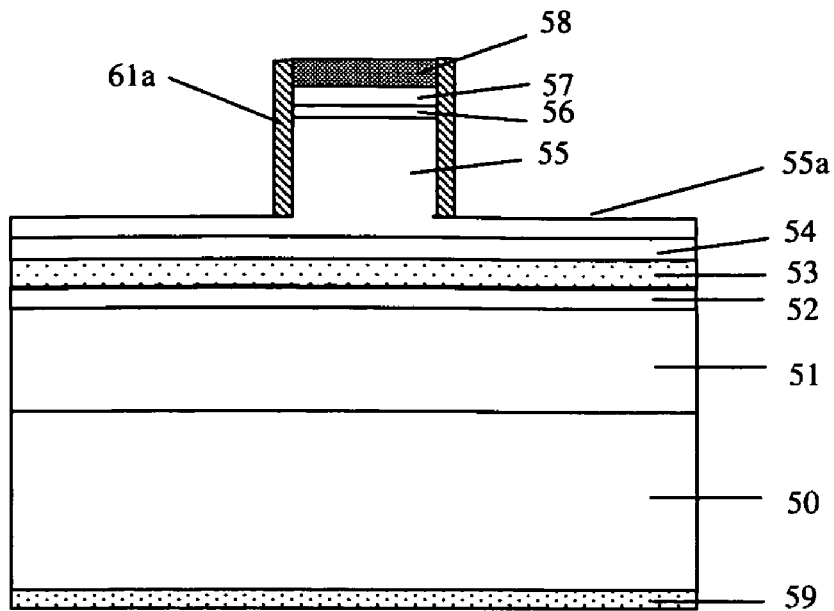

The insulator layer 61 is then dry-etched in RIE. The RIE dry etching process is anisotropic, hence the $SiO_2$ thickness at the mesa sidewalls would be considered to be much thicker than the $SiO_2$ layers at the etched surfaces 55a and on top of the ridge. The etch step is then calibrated to etch a thickness of ~100 nm of $SiO_2$ and the resulting structure is shown in FIG. 10E. The method described to obtain an insulator layer that only encapsulates the mesa sidewalls 61a is conveniently self-aligning, hence bypassing any difficult alignment step.

Figure 10F:
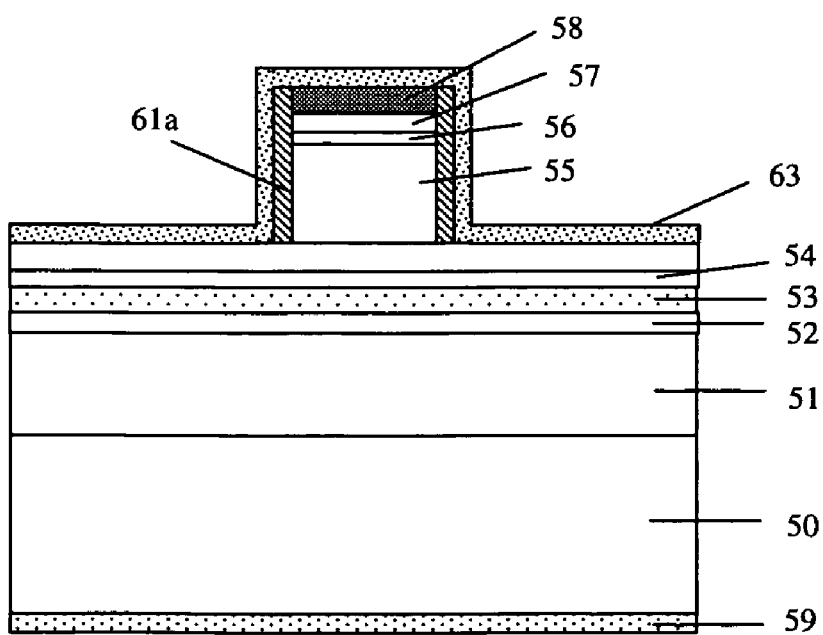

Referring to FIG. 10F, the second insulator layer 63 (with good thermal conductivity properties such as AlN) having a thickness of ~80 nm is then deposited over the entire area. This can be done using techniques such as sputtering, electron cyclotron resonance (ECR), MBE or others. For this stage, the sidewall conformality of the deposition technique is not critical.

Figure 10G:
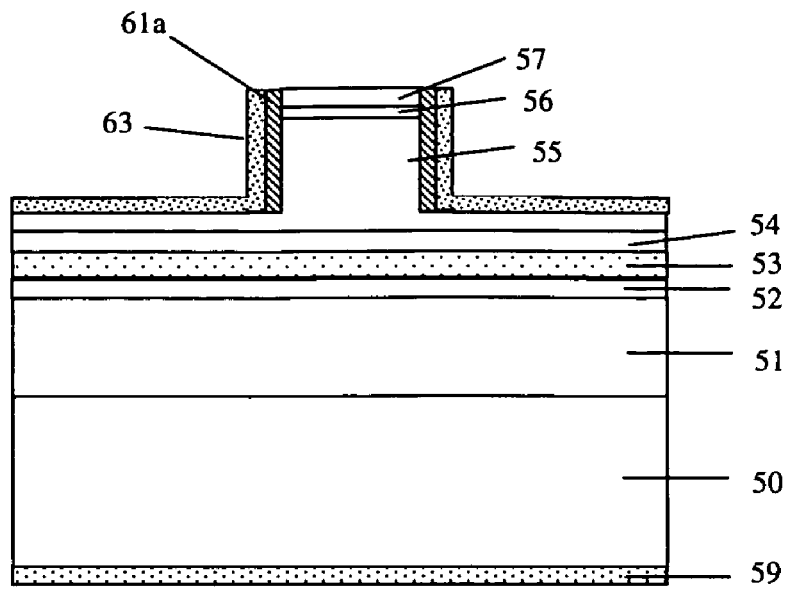

Referring to FIG. 10G, the sacrificial layer 58 is then lifted-off by means of wet etching to open a window on top of the ridge for electrical contact. Mechanical agitation such as 'ultrasonic bath' may assist the lift-off process.

Figure 10H:
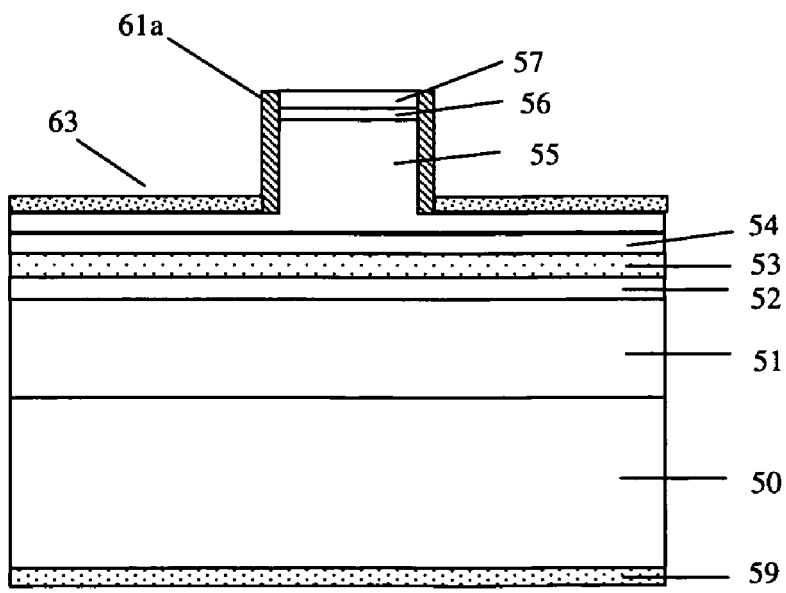

The second insulator layer is then wet etched (i.e KOH is used for etching AlN). The thickness of the second insulator layer at the sidewalls can be thinned or completely removed in this step. In this respect, refer to FIG. 10H.

viii) Embodiment 8

A manufacturing method of the present invention for embodiment 4 will be described with reference to FIGS. 11A-11M and the drawings are not done to scale. The method sequences described however do not represent a complete fabrication process for the respective chip, but rather represent those germane to the present invention.

Figure 11A:
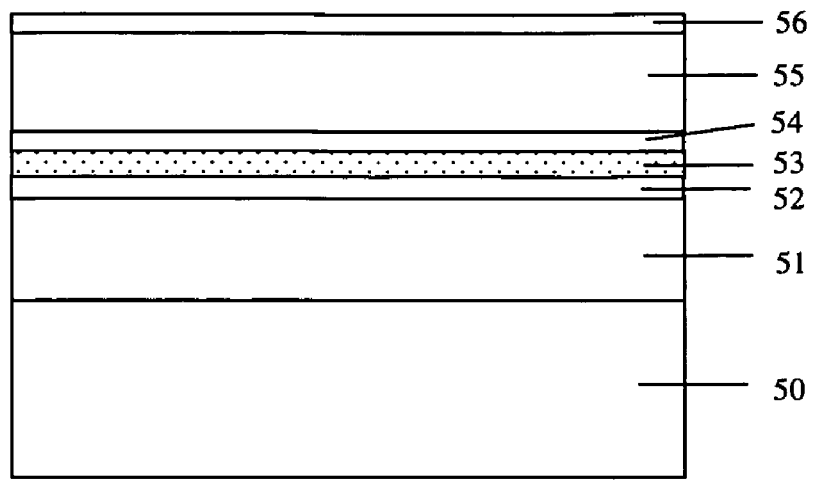
FIGS. 11A through 11M are cross sectional views illustrating a method of manufacturing a laser diode according to Embodiment 8 in the present invention.
Figure 11B:
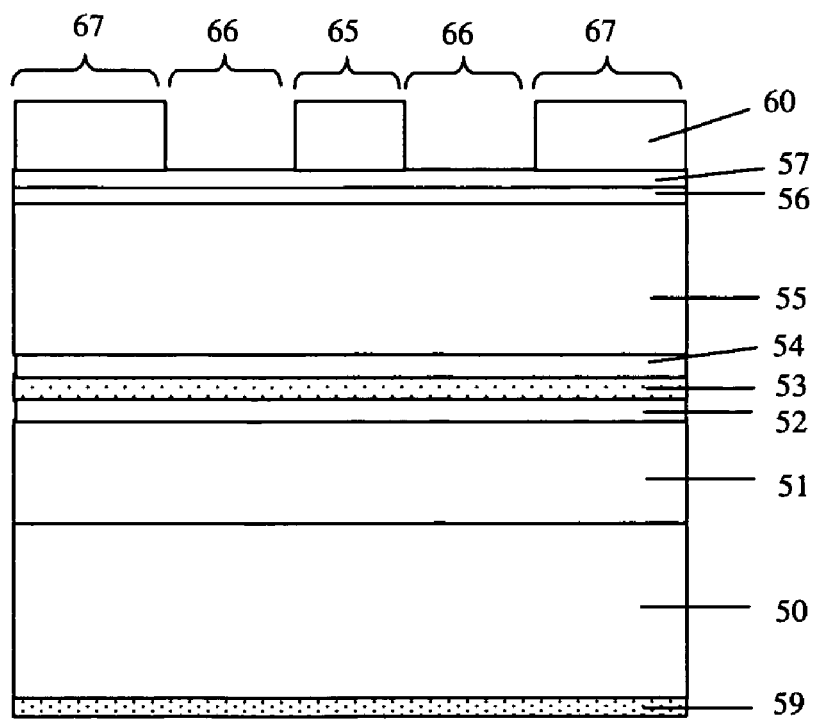

Referring to FIG. 11A, the laser diode structure is similar to that of FIG. 10A. From FIG. 11B, a first p-type electrode layer 57 (such as Pd) is applied over the whole area and the n-type electrode 59 (such as Ti/Al) is formed on the n-substrate. A photoresist layer 60 is then applied and patterned to define the area of the ridge 65, channels 66 and platform area 67.

Figure 11C:
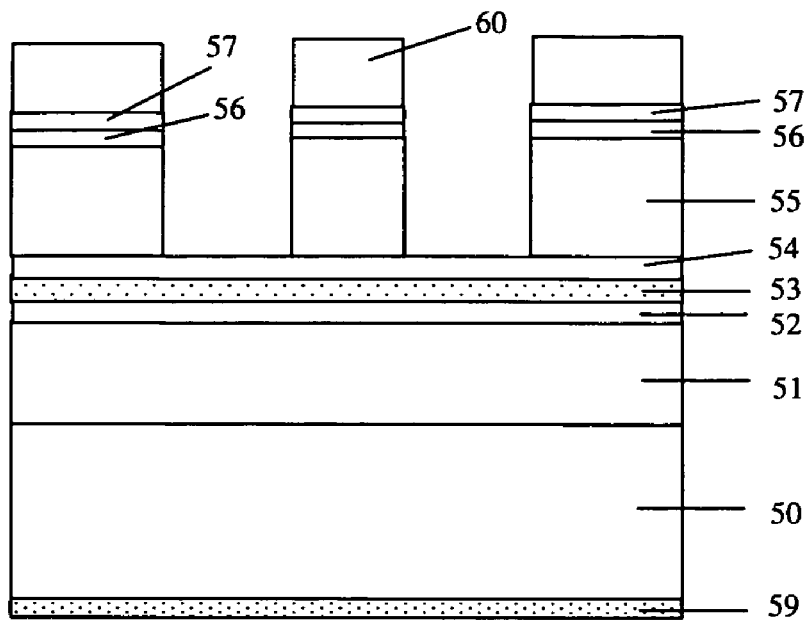
Figure 11D:
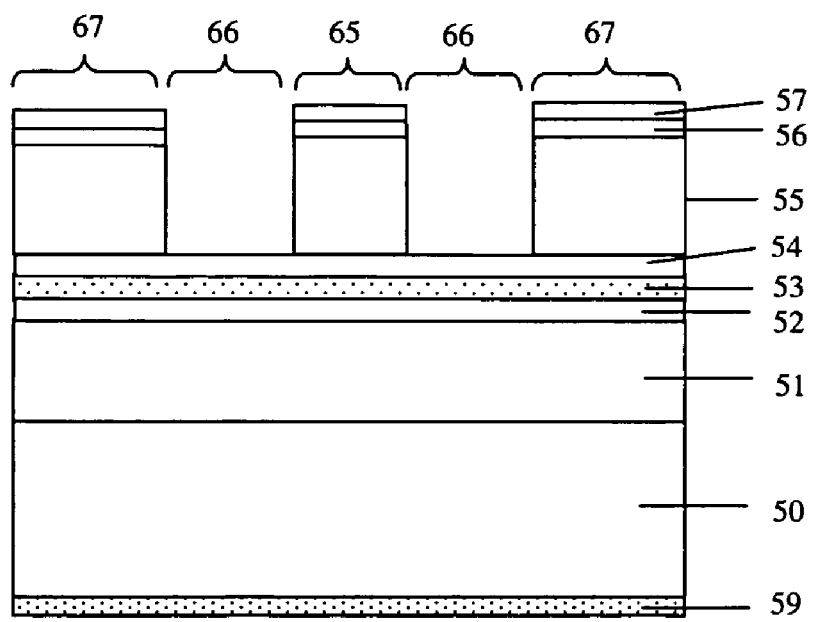

In FIG. 11C, the p-type electrode 57 is then completely removed from regions not protected by the photoresist using dry etching (for example, by means of ICP or RIE). Using the same photoresist mask, the epitaxial layer is then etched to a predetermined depth (500 nm in this case) by inductively coupled plasma, usually down to the lower half of the upper cladding layer or at the p-type upper waveguide layer 54 (shown in this case). The photoresist mask is then removed and is shown in FIG. 11D.

Figure 11E:
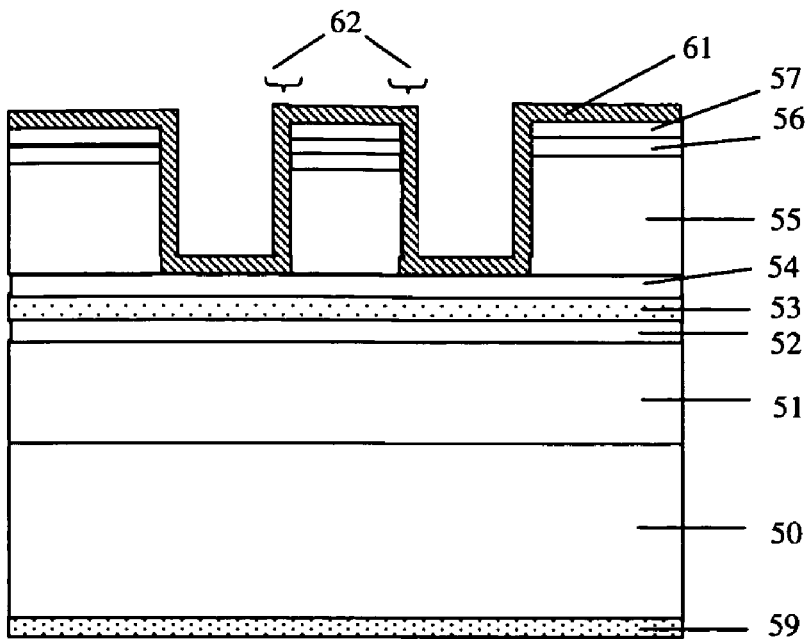

The first insulation layer 61 made of $SiO_2$ (due to its low refractive index of 1.5) having a thickness of ~100 nm is deposited over the entire area by means of PECVD or sputtering. It is essential that a deposition system with good sidewall conformality be used for this process. Since the ridge has a good aspect ratio (appears almost vertical), and owing to the conformal sidewall coverage of the SiO$_2$ deposition, the thickness of the SiO$_2$ at the mesa sidewalls 62, when viewed from the top appears to be at least 500 nm. This is shown in FIG. 11E.

Figure 11F:
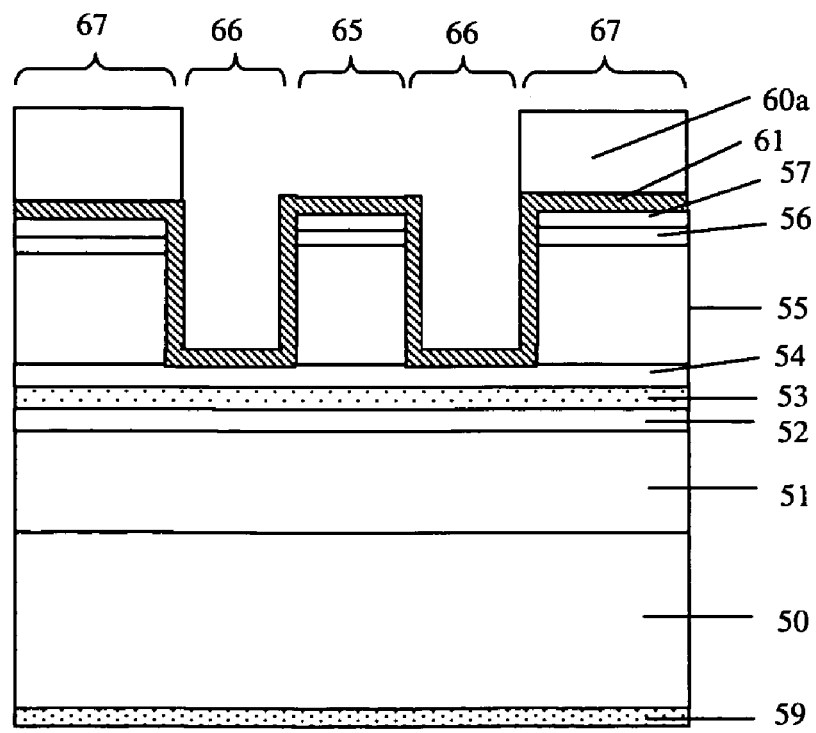
Figure 11G:
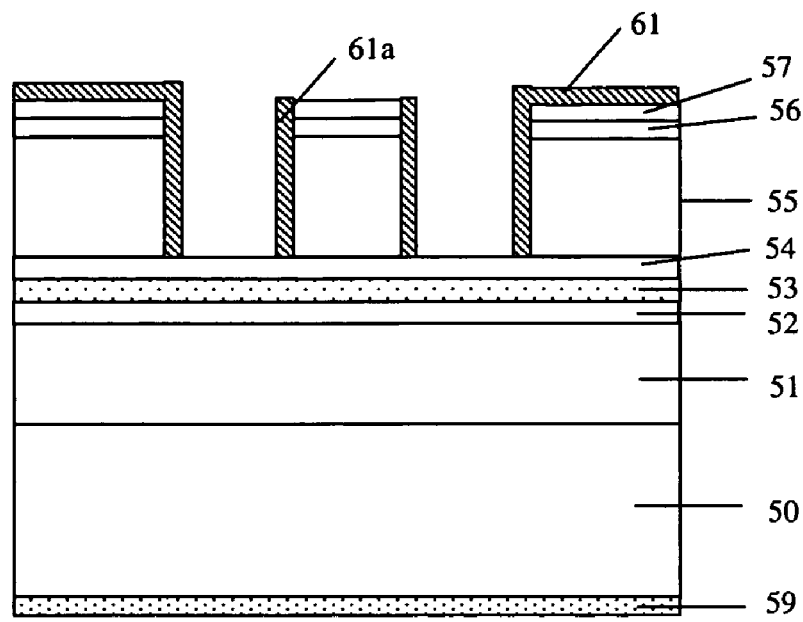

A photoresist layer 60a is then patterned in order for the channel 66 and ridge region 65 to be exposed, but the platform area 67 protected (FIG. 11F). The insulator layer 61 is then dry-etched in RIE. The RIE dry etching process is anisotropic, hence the SiO$_2$ thickness at the mesa sidewalls 62 would be considered to be much thicker than the SiO$_2$ layers at the p-waveguide layer 54 and on top of the ridge. The etch step is then calibrated to etch a thickness of ~100 nm of SiO$_2$ and the photoresist layer removed. The resulting structure is shown in FIG. 11G. The method described to obtain an insulator layer that only encapsulates the mesa sidewalls 61a is conveniently self-aligning, hence bypassing any difficult alignment step.

Figure 11H:
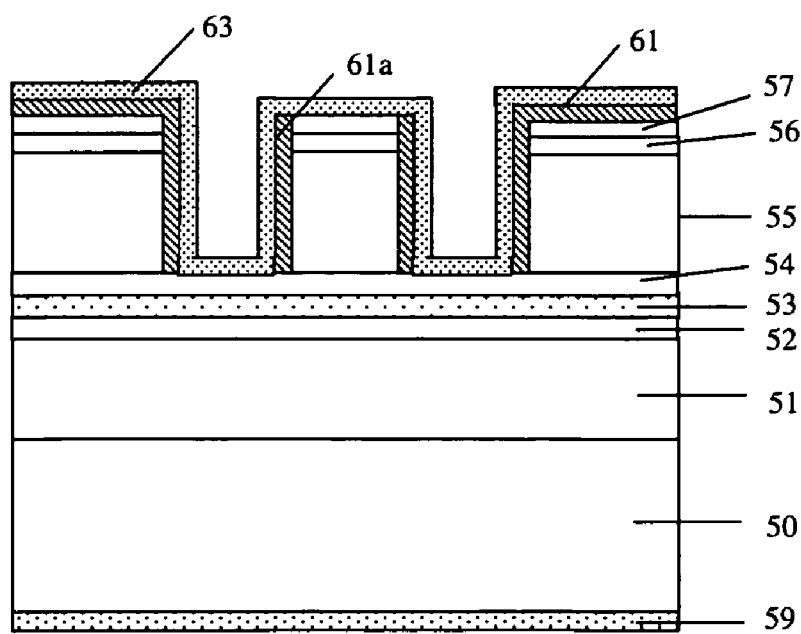

Referring to FIG. 11H, the second insulator layer 63 (with good thermal conductivity properties such as AlN) having a thickness of ~80 nm is then deposited over the entire area. This can be done using techniques such as sputtering, electron cyclotron resonance (ECR), MBE or others. For this stage, the sidewall conformality of the deposition technique is not critical.

Figure 11I:
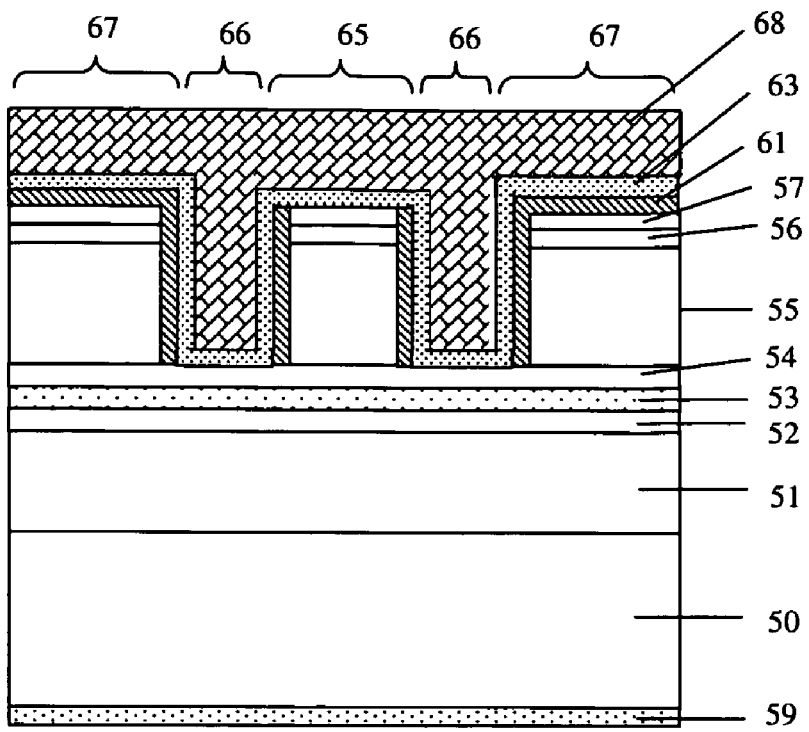
Figure 11J:
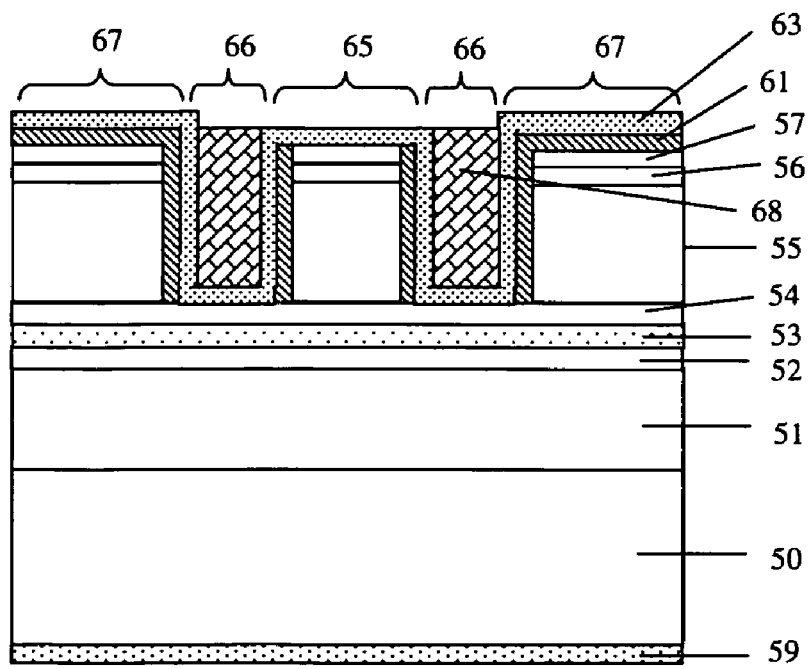

Referring to FIG. 11I, a layer of photoresist 68 (~1 um thick) is then deposited onto the sample by spin coating. Due to the nature of spin coating, the photoresist layer 68 will be thicker at the channel layer 66 than on the ridge 65 and platform area 67. The photoresist layer is then etched using an anisotropic method such as RIE (i.e., using O$_2$ plasma). Since the photoresist is thicker at the channel region 66, the anisotropic etch is calibrated such the photoresist is removed on the platform 67 and ridge area 65 but some resist will be left on the channel region 66. This resulting structure is shown on FIG. 11J.

Figure 11K:
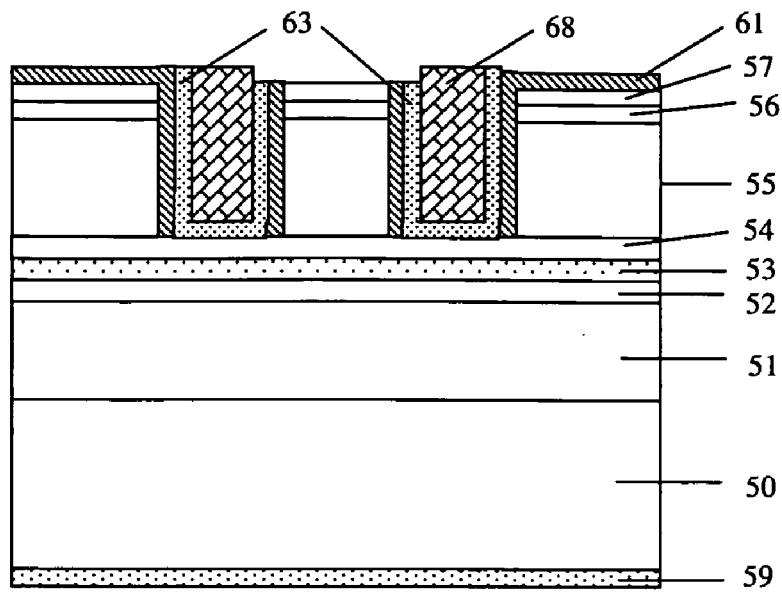
Figure 11L:
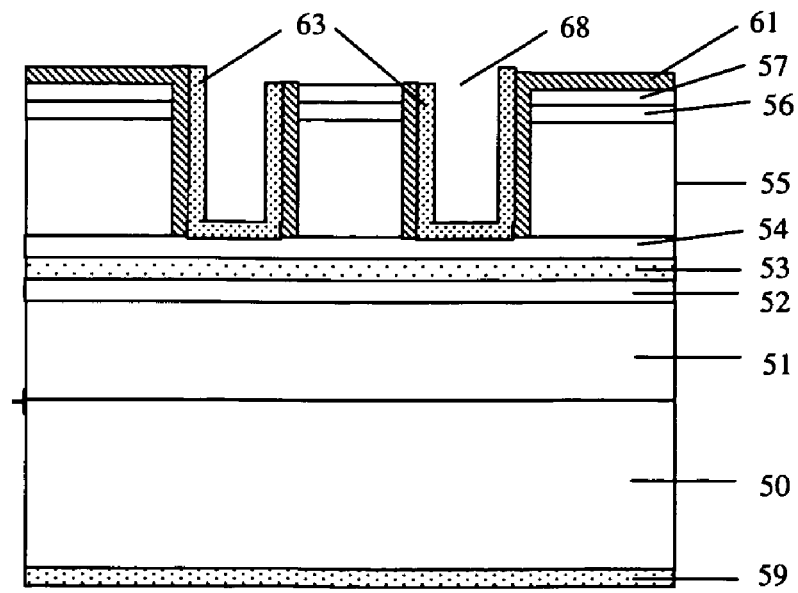
Figure 11M:
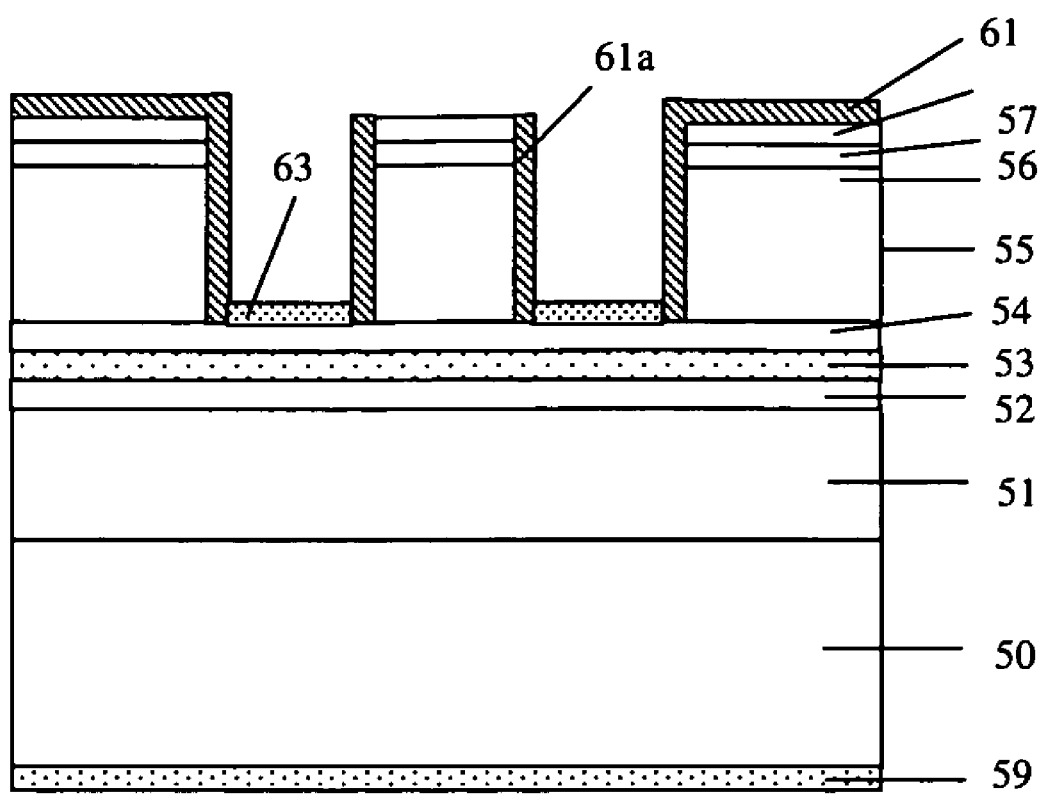

The second insulator layer 63 on the platform 67 and ridge region 65 is then dry-etched using RIE, with the photoresist layer protecting the second insulator layer 63 at the channel region 66 (FIG. 11K). Subsequently, the photoresist layer is then removed and this is shown in FIG. 11L. The second insulator layer is then wet etched (i.e KOH is used for etching AlN). The thickness of the second insulator layer at the sidewalls can be thinned or completely removed in this step. In this respect, refer to FIG. 11M.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A ridge structure semiconductor laser diode, comprising:
a first material encapsulating and directly contacting with the ridge sidewalls, the first material having a refractive index which is greater than 1.0, and
a second material, different from the first material, encapsulating and directly contacting with etched regions adjacent the ridge sidewalls of the structure to the exclusion of the first material, where the etched regions define the ridge structure,
wherein the first material is one of a low refractive index insulator and a high thermal conductivity insulator, and the second material is the other of the low refractive index insulator and the high thermal conductivity insulator,
wherein the first material is the low refractive index insulator and the second material is the high thermal conductivity insulator, and
wherein the low refractive index insulator encapsulates the ridge sidewalls at the bottom region of the ridge, and the high thermal conductivity insulator encapsulates the etched regions of the structure and the upper region of the ridge sidewalls.

2. A ridge structure semiconductor laser diode, comprising:
a first material encapsulating and directly contacting with the ridge sidewalls, the first material having a refractive index which is greater than 1.0, and
a second material, different from the first material, encapsulating and directly contacting with etched regions adjacent the ridge sidewalls of the structure to the exclusion of the first material, where the etched regions define the ridge structure, and
wherein the first material is one of a low refractive index insulator and a high thermal conductivity insulator, and the second material is the other of the low refractive index insulator and the high thermal conductivity insulator, and
wherein the first material is the high thermal conductivity insulator and the second material is the low refractive index insulator.

3. The laser diode of claim 2, wherein the low refractive index insulator has a refractive index which is greater than 1.0 and at least 0.1 less than the index of refraction of the ridge.

4. The laser diode of claim 1, wherein the refractive index of the low refractive insulator is substantially within the range of 1.55 to 2.32.

5. The laser diode of claim 1, wherein the high thermal conductivity insulator has a thermal conductivity of at least 10 W/mK.

6. The laser diode of claim 1, wherein the refractive index of the low refractive insulator is substantially within the range of 1.55 to 2.32, and the high thermal conductivity insulator has a thermal conductivity of at least 200 W/mK.

7. A ridge structure semiconductor laser diode, comprising:
a first material encapsulating and directly contacting with the ridge sidewalls, the first material having a refractive index which is greater than 1.0, and
a second material, different from the first material, encapsulating and directly contacting with etched regions adjacent the ridge sidewalls of the structure to the exclusion of the first material, where the etched regions define the ridge structure, and
wherein the first material is one of a low refractive index insulator and a high thermal conductivity insulator, and the second material is the other of the low refractive index insulator and the high thermal conductivity insulator, and
wherein the ridge structure is formed within a trench structure.

8. The laser diode of claim 7, wherein the low refractive index insulator has a refractive index which is greater than 1.0 and at least 0.1 less than the index of refraction of the ridge.

9. The laser diode of claim 7, wherein the refractive index of the low refractive insulator is substantially within the range of 1.55 to 2.32.

10. The laser diode of claim 7, wherein the high thermal conductivity insulator has a thermal conductivity of at least 10 W/mK.

11. The laser diode of claim 7, wherein the high thermal conductivity insulator has a thermal conductivity of at least 200 W/mK.

12. The laser diode of claim 7, wherein the refractive index of the low refractive insulator is substantially within the range of 1.55 to 2.32, and the high thermal conductivity insulator has a thermal conductivity of at least 200 W/mK.

13. A ridge structure semiconductor laser diode, comprising:
   a first material encapsulating and directly contacting with the ridge sidewalls, the first material having a refractive index which is greater than 1.0, and
   a second material, different from the first material, encapsulating and directly contacting with etched regions adjacent the ridge sidewalls of the structure to the exclusion of the first material, where the etched regions define the ridge structure, and
   wherein the first material is one of a low refractive index insulator and a high thermal conductivity insulator, and the second material is the other of the low refractive index insulator and the high thermal conductivity insulator, and
   wherein the low refractive index insulator exhibits an optical absorption greater than 1000 $cm^1$ at the wavelength of the laser diode.

14. The laser diode of claim 13, wherein the low refractive index insulator has a refractive index which is greater than 1.0 and at least 0.1 less than the index of refraction of the ridge.

15. The laser diode of claim 13, wherein the refractive index of the low refractive insulator is substantially within the range of 1.55 to 2.32.

16. The laser diode of claim 13, wherein the high thermal conductivity insulator has a thermal conductivity of at least 10 W/mK.

17. The laser diode of claim 13, wherein the high thermal conductivity insulator has a thermal conductivity of at least 200 W/mK.

18. The laser diode of claim 13, wherein the refractive index of the low refractive insulator is substantially within the range of 1.55 to 2.32, and the high thermal conductivity insulator has a thermal conductivity of at least 200 W/mK.

19. A ridge structure semiconductor laser diode, comprising:
   a first material encapsulating and directly contacting with the ridge sidewalls, the first material having a refractive index which is greater than 1.0, and
   a second material, different from the first material, encapsulating and directly contacting with etched regions adjacent the ridge sidewalls of the structure to the exclusion of the first material, where the etched regions define the ridge structure, and
   wherein the first material is one of a low refractive index insulator and a high thermal conductivity insulator, and the second material is the other of the low refractive index insulator and the high thermal conductivity insulator,
   wherein the low refractive index insulator has a refractive index which is greater than 1.0, and
   wherein the refractive index of the low refractive index insulator is at least 0.5 less than the index of refraction of the ridge.

20. The laser diode of claim 19, wherein the refractive index of the low refractive index insulator is at least 1.0 less than the index of refraction of the ridge.

21. A ridge structure semiconductor laser diode, comprising:
   a first material encapsulating and directly contacting with the ridge sidewalls, the first material having a refractive index which is greater than 1.0, and
   a second material, different from the first material, encapsulating and directly contacting with etched regions adjacent the ridge sidewalls of the structure to the exclusion of the first material, where the etched regions define the ridge structure, and
   wherein the first material is one of a low refractive index insulator and a high thermal conductivity insulator, and the second material is the other of the low refractive index insulator and the high thermal conductivity insulator, and
   wherein the high thermal conductivity insulator has a thermal conductivity of at least 200 W/mK.

* * * * *